(12) United States Patent
Kitagawa et al.

(10) Patent No.: US 8,913,416 B2
(45) Date of Patent: Dec. 16, 2014

(54) VARIABLE-RESISTANCE MEMORY DEVICE AND ITS OPERATION METHOD

(75) Inventors: Makoto Kitagawa, Kanagawa (JP); Tsunenori Shiimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 326 days.

(21) Appl. No.: 13/460,159

(22) Filed: Apr. 30, 2012

(65) Prior Publication Data

US 2012/0294064 A1 Nov. 22, 2012

(30) Foreign Application Priority Data

May 20, 2011 (JP) ................................. 2011-113268

(51) Int. Cl.
*G11C 11/00* (2006.01)
*G11C 13/00* (2006.01)

(52) U.S. Cl.
CPC ........ *G11C 13/0007* (2013.01); *G11C 2213/56* (2013.01); *G11C 13/0011* (2013.01); *G11C 2013/0073* (2013.01); *G11C 2213/79* (2013.01); *G11C 13/0061* (2013.01); *G11C 13/0069* (2013.01)
USPC ........... 365/148; 365/158; 365/163; 365/171; 365/173

(58) Field of Classification Search
CPC ........... G11C 13/0004; G11C 13/0007; G11C 13/0069
USPC .......................... 365/148, 158, 163, 171, 173
See application file for complete search history.

(56) References Cited

U.S. PATENT DOCUMENTS

| 2007/0159867 A1* | 7/2007 | Muraoka et al. ............... 365/100 |
| 2009/0168505 A1* | 7/2009 | Hanzawa et al. ............. 365/163 |
| 2010/0118588 A1* | 5/2010 | Chen et al. .................... 365/148 |

FOREIGN PATENT DOCUMENTS

| JP | WO2007-015358 | 2/2007 |
| JP | 2010-170617 | 8/2010 |

OTHER PUBLICATIONS

K. Aratani et al., "A Novel Resistance Memory with High Scalability and Nanosecond Switching," Technical Digest IEDM 2007, pp. 783-786.
S. Sheu et al., "A 5ns Fast Write Multi-Level Non-Volatile 1 K bits RRAM Memory with Advance Write Scheme," 2009 Symposium on VLSI Circuits Digest of Technical Papers, pp. 82-83.

* cited by examiner

*Primary Examiner* — Tha-O H Bui
(74) *Attorney, Agent, or Firm* — Rader, Fishman & Grauer PLLC

(57) ABSTRACT

Disclosed herein is a variable-resistance memory device including a first common line; a second common line; a storage element connected between the first common line and the second common line to serve as a storage element whose resistance changes in accordance with a voltage applied to the storage element; and a driving control circuit.

13 Claims, 15 Drawing Sheets

F I G . 1
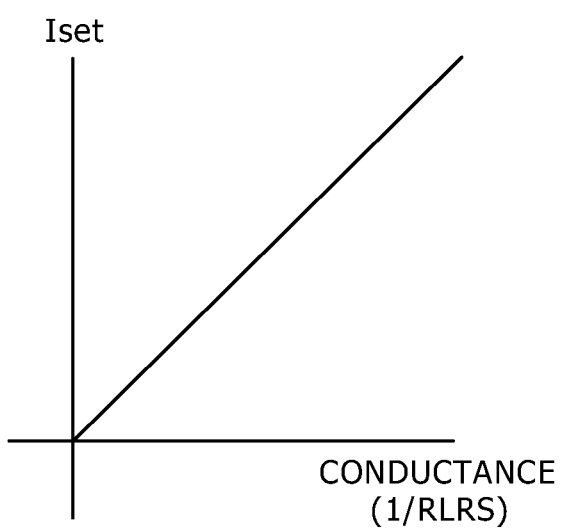

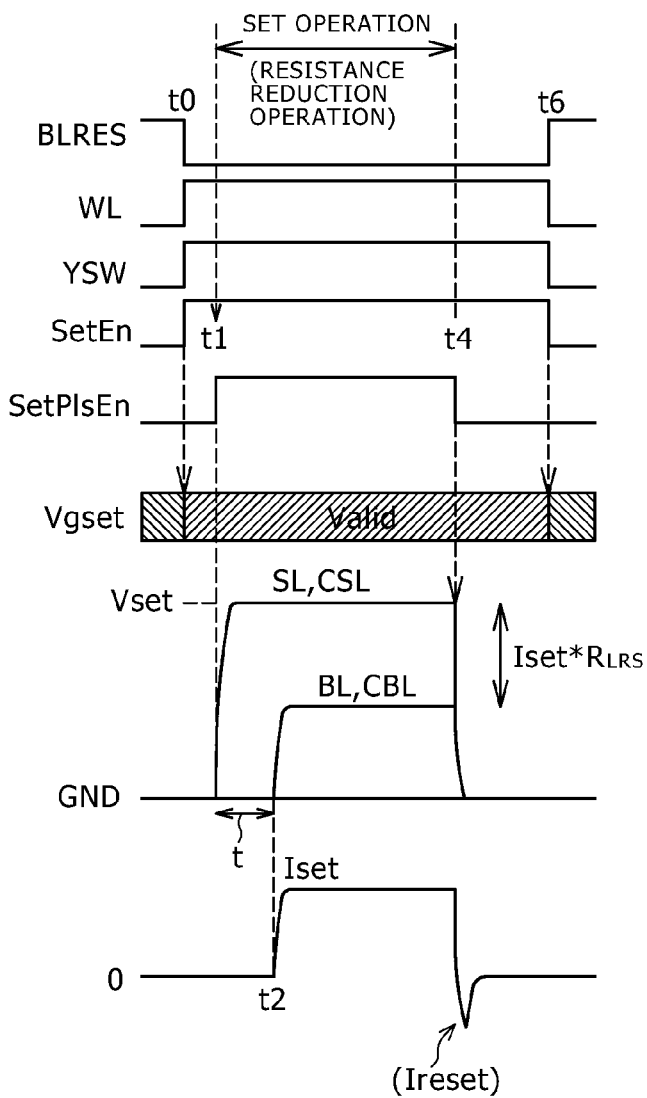

FIG.12E1

VARIABLE-RESISTANCE MEMORY DEVICE AND ITS OPERATION METHOD

BACKGROUND

The presently disclosed technology relates to a variable-resistance memory device employing a storage element connected between first and second common lines to serve as an element having its resistance changing in accordance to a voltage applied to the element and relates to an operation method for operating the variable-resistance memory device.

There is known a variable-resistance memory device employing a storage element in every memory cell of the device. The resistance of the memory element changes because conductive ions are injected into an insulator film or conductive ions are pulled out from the insulator film. Refer to documents such as "A Novel Resistance Memory with High Scalability and Nanosecond Switching," K. Aratani, K. Ohba, T. Mizuguchi, S. Yasuda, T. Shiimoto, T. Tsushima, T. Sone, K. Endo, A. Kouchiyama, S. Sasaki, A. Maesaka, N. Yamada and H. Narisawa, Technical Digest IEDM 2007, pp. 783-786 (hereinafter referred to as Non-Patent Document 1).

The storage element has a laminated structure provided between two electrodes. The laminated structure includes a layer, which serves as a supplier of the conductive ions, and the insulator film. Every memory cell employs a variable-resistance storage element and an access transistor which are connected to each other in series between a bit line and a plate in such a way that active-matrix driving can be applied to the storage element and the access transistor.

Since every memory cell employed in the variable-resistance memory device as described above includes one access transistor (T) and one variable-resistance resistive element (R) serving as a variable-resistance storage element, the variable-resistance memory device is a kind of 1T1R memory adopting a current-drive method. In general, the memory making use of conductive ions and a memory making use of insulation-layer oxidations as well as insulation-layer reductions are popularly referred to as a ReRAM.

In the ReRAM, a large resistance of the storage element is associated with an operation to write data into the memory cell whereas a small resistance of the storage element is associated with an operation to erase data from the memory cell, and the ReRAM is capable of carrying out the operation to write data into the memory cell as well as the operation to erase data from the memory cell by making use of a pulse having a short duration of the order of nanoseconds. Thus, as an NVM (Non-Volatile Memory) capable of carrying out operations at a high speed, the ReRAM draws attention in the same way as the RAM (Random-Access Memory).

FIG. 1 is a diagram showing a correlation between a conductance and a current in an LRS (low-resistance state) of a ReRAM making use of conductive ions. The conductance is the reciprocal of the low resistance (RLRS).

The horizontal axis of FIG. 1 represents the conductance in the LRS whereas the vertical axis of the same figure represents the magnitude of a set current Iset in a resistance reduction operation also referred to as a set operation in this case.

As is obvious from FIG. 1, the resistance of the storage element changes all but linearly with the set current Iset. Such a characteristic can also be realized as well in a variable-resistance memory such as another ReRAM.

Thus, the ReRAM has a merit that the distribution of the resistance can be narrowed by executing the current control with a high degree of precision and a merit that a multi-value memory can be implemented.

However, if the current control is executed with a low degree of precision, on the other hand, the ReRAM has a demerit that it is difficult to obtain a desired narrow distribution of the resistance. In addition, if the current control is executed with a low degree of precision, the ReRAM also has another demerit that it is difficult to carry a reset operation particularly with an excessive magnitude of the current supplied to the ReRAM or another demerit accompanying an overset which is deterioration of the repetition characteristic. The reset operation is an operation carried out to increase the resistance of the storage element.

As a method for controlling the current of the storage element, there are known a word-line current control method for controlling the current of the storage element and a bit-line current control method for controlling a current flowing through a bit line. The word-line current control method is a method for controlling an electric potential appearing at the gate electrode of the access transistor.

In the case of the word-line current control method, the word line includes a number of large gate capacitances as parasitic capacitances due to the fact that the word line is made from metal of the gate electrode. Thus, the wire capacitance is large so that it is difficult to execute the word-line current control method. In the case of the bit-line current control method, on the other hand, the bit line is created on an upper-layer wiring layer. Thus, the wire capacitance per unit length can be reduced. As a result, the word-line current control can be executed by making use of a circuit having a small driving power.

The bit-line current control method for controlling the current of the storage element by controlling a current flowing through the bit line is proper for a cell array structure allowing voltage driving to be carried out by separating not only the bit and word lines, but also source lines in the row or column direction. This current control method can be applied with ease to the so-called 3-line system which is the name of a structure or a system (or, strictly speaking, an access system). Typical examples of the 3-line system are given in "A 5 ns Fast Write Multi-Level Non-Volatile 1 Kbits RRAM Memory with Advance Write Scheme," Shyh-Shyuan Sheu, Pei-Chia Chiang, Wen-Pin Lin, Heng-Yuan Lee, Pang-Shiu Chen, Yu-Sheng Chen, Tai-Yuan Wu, Frederick T. Chen, Yu-Sheng Chen, Keng-Li Su, Ming-Jer Kao, Kuo-Hsing Cheng and Ming-Jinn Tsai.

With regard to the bit-line current control method applied to the 3-line system, inventors of the presently disclosed technology have already made some proposals described in documents such as Japanese Patent Laid-open No. 2010-170617 (hereinafter referred to as Patent Document 1). In addition, Public-Reannounced Patent No. WO 2007/015358 given below discloses a typical example in which the bit-line current control method is applied to a variable-resistance memory adopting a spin injection system.

In the bit-line current control method applied to the 3-line system as described in Patent Document 1, for example, the drain electrode of an NMOS transistor serving as a current control transistor is connected to the bit line whereas the voltage appearing at the gate electrode of the transistor is controlled by a control circuit. In this control, after an inversion to a resistance reduction state of the storage element, the control circuit controls the current control transistor in order to drive an access transistor to operate in a saturated region and to control an electric potential appearing on the bit line so that a current flowing through the storage element is sustained at a constant magnitude. Thus, even if the resistance of the storage element changes or even if there are variations from storage element to storage element, the set current which is the current flowing through the storage element after the inversion is sustained at a constant magnitude so that it is possible to effectively avoid or repress element-characteristic deteriorations accompanying an overset because no excessive current flows.

As described above, in the 3-line system adopting the bit-line current control method, a resistance changing operation can be carried out at a high speed so that it is possible to repress variations of the resistance distribution obtained after the change of the resistance of the storage element without deteriorating the characteristic of the storage element. In addition, the 3-line system adopting the bit-line current control method offers the merit of a low cost because the size of an area occupied by the control circuit is small due to the fact that it is sufficient to provide even a driving capability lower than that of a system adopting the word-line current control method.

It is to be noted that Non-Patent Document 1 discloses an array configuration in which, because of easiness of a fabrication process, an upper electrode is fabricated into a plate shape and the drain electrode of the access transistor is used as a storage node. In addition, the source electrode of the access transistor is connected to a bit line fabricated into a line shape. Since two lines are used to select a memory cell, the array configuration is referred to as a 3-line system.

SUMMARY

In the method for controlling a current flowing through a bit line in a 3-line system as disclosed in Patent Document 1, control of the set operation is carried out as follows.

At the start time of the set operation, the source line is typically set at an electric potential higher than that of the bit line in order to drive a current to flow from the source line to the bit line through the storage element. Then, after the elapse of time sufficient for the state of the storage element to change to a low-resistance state, the electric potential appearing on the source line is restored to the low level set prior to the set operation and the set operation is ended.

In the 3-line system adopting the bit-line current control method, the electric potential appearing on the bit line is not zero or the ground electric potential. Instead, the electric potential appearing on the bit line is controlled dynamically to an electric potential at a level of a certain degree. Thus, the state immediately preceding the end of the set operation is a state in which electric charge having an amount of a certain degree is accumulated on the bit line. If an electric potential appearing on the source line is controlled to a low electric potential in this state, a current instantaneously flows to the storage element in a reset direction which is a direction opposite to the direction of the set current.

The bit line has a small wire capacitance in comparison with that of the word line. In a memory device having a large storage capacity, however, a number of memory cells are connected to a bit line so that the wire capacitance of the bit line increases. Thus, if electric charge accumulated in the relatively large wire capacitance of the bit line flows in a concentrated manner into a storage element of a memory cell serving as the only one selected among memory cells on a memory-cell column, the resistance of the storage element controlled to a desired low resistance by a set operation may increase in some cases. In other words, a disturbance having a bad effect on the set state is generated due to a discharge current (or a reset current) instantaneously flowing to the storage element in a reset direction opposite to the direction of the set current at the end of the set operation.

The generation of such a disturbance is detrimental to the precise controllability of the resistance of the storage element in the bit-line current control.

As is obvious from the above description, when the current flowing through the storage element is controlled by executing the bit-line current control, it is necessary to effectively avoid or repress the opposite-direction electrical discharging occurring at the end of the set operation as a phenomenon detrimental to the precise controllability of the resistance of the storage element.

It is to be noted that, also from a state in which the electric potential appearing on the bit line and the electric potential appearing on the source line are sustained at a high level, a resistance reduction operation (such as a set operation) can be carried out by changing the electric potential appearing on the bit line to a lower level.

It is thus an object of the presently disclosed technology to provide a variable-resistance memory device starting a resistance reduction operation by changing either an electric potential appearing on a bit line or an electric potential appearing on a source line and carrying out current control by adjusting either the electric potential appearing on the source line or the electric potential appearing on the bit line and provide an operation method for operating the variable-resistance memory device with a technology for avoiding or repressing an electrical-discharging current flowing in the opposite direction.

A variable-resistance memory device according to embodiments of the presently disclosed technology includes a first common line, a second common line, a storage element and a driving control circuit.

The resistance of the storage element connected between the first common line and the second common line changes in accordance with a voltage applied to the storage element.

The driving control circuit starts a resistance reduction operation of driving the storage element to make a transition from a high-resistance state to a low-resistance state by changing an electric potential appearing on the second common line, controls an element current flowing through the storage element by adjusting an electric potential appearing on the first common line during the resistance reduction operation and terminates the resistance reduction operation by making the electric potential appearing on the first common line equal to the electric potential appearing on the second common line after the lapse of a period sufficient for the storage element to make the transition from the high-resistance state to the low-resistance state.

According to an operation method provided by the embodiments of the presently disclosed technology to serve as a method for operating a variable-resistance memory device including a first common line, a second common line and a storage element connected between the first common line and the second common line to serve as an element having a resistance varying in accordance with a voltage applied to the element, the variable-resistance memory device is controlled and driven to carry out the step of starting a resistance reduction operation of driving the storage element to make a transition from a high-resistance state to a low-resistance state by changing an electric potential appearing on the second common line, the step of controlling an element current flowing through the storage element by adjusting an electric potential appearing on the first common line during the resistance reduction operation and the step of terminating the resistance reduction operation by making the electric potential appearing on the first common line equal to the electric potential appearing on the second common line after the lapse of a period sufficient for the storage element to make the transition from the high-resistance state to the low-resistance state.

In accordance with the configurations described above, in place of a method adopted prior to the introduction of the presently disclosed technology, a resistance reduction operation is started by changing an electric potential appearing on the second common line and terminated by making an electric potential appearing on the first common line equal to the electric potential appearing on the second common line. Thus, electric charge accumulated on the first common line immediately before the resistance reduction operation is electrically discharged to the second common line through an equalization path other than the current path of the storage element. As a result, an opposite-direction current having a bad effect on the low-resistance state does not flow to the storage element. The opposite-direction current cited above is a current flowing in the resistance increasing direction.

In accordance with a variable-resistance memory device provided by the embodiments of the presently disclosed technology to serve as a device starting a resistance reduction operation by changing an electric potential appearing on the second common line which is either a bit line or a source line and in accordance with an operation method provided by the embodiments of the presently disclosed technology to serve as a method for operating the device, an electrical-discharging current flowing in an opposite direction can be avoided or repressed.

BRIEF DESCRIPTION OF THE DRAWINGS

FIG. 1 is a diagram showing a correlation between a conductance and a current in a low-resistance state of a ReRAM making use of conductive ions;

FIGS. 6A to 6H are diagrams showing operation waveforms of signals in the configuration of the basic column circuit;

DETAILED DESCRIPTION OF THE PREFERRED EMBODIMENTS

Embodiments of the presently disclosed technology are explained by referring to accompanying diagrams and taking a variable-resistance memory device having its resistance changing in accordance with movements of conductive ions as a typical example.

The embodiments are described in chapters arranged as follows:
1. First Embodiment: The bit and source lines are used as first and second common lines respectively;
2. Second Embodiment: The source and bit lines are used as first and second common lines respectively;
3. Third Embodiment: A P-type transistor is used as an access transistor;
4. Fourth Embodiment: A single N-type transistor is used as a short-circuit switch;
5. Fifth Embodiment: A single P-type transistor is used as a short-circuit switch.

1: First Embodiment

The Configuration of a Memory Cell

Figure 2A:
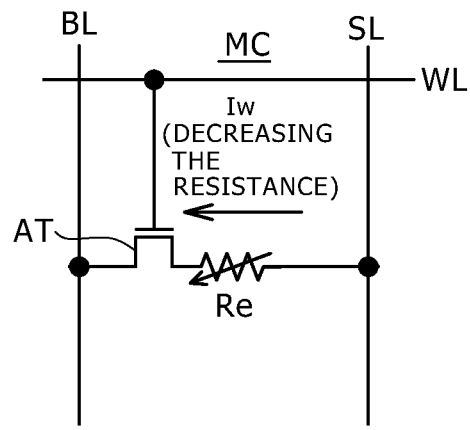
FIGS. 2A and 2B are diagrams each showing an equivalent circuit of a memory cell.
Figure 2B:
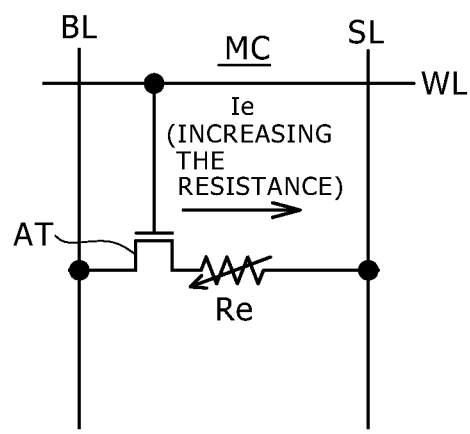

FIGS. 2A and 2B are diagrams each showing an equivalent circuit of a memory cell MC having a configuration common to the embodiments. To be more specific, FIG. 2A is a diagram showing the flowing direction of a write current whereas FIG. 2B is a diagram showing the flowing direction of an erase current. However, the memory-cell configurations themselves shown in the figures are entirely identical with each other.

The memory cell MC shown in FIG. 1 includes an access transistor AT and a variable-resistance resistive element Re serving as a variable-resistance storage element.

A specific end of the variable-resistance resistive element Re is connected to a source line SL whereas the other end of the variable-resistance resistive element Re is connected to the source electrode of the access transistor AT. The drain electrode of the access transistor AT is connected to a bit line BL whereas the gate electrode of the access transistor AT is connected to a word line WL. In the configuration according to this embodiment, the bit line BL is a typical example of the first common line whereas the source line SL is a typical example of the second common line.

In FIGS. 2A and 2B, the bit line BL and the source line SL are shown as lines parallel to each other. It is to be noted, however, that implementations of the memory cell MC are by no means limited to such a configuration.

In this embodiment, as described above, each memory cell MC is connected to three lines, that is, a bit line BL serving as the first common line, a source line SL serving as the second common line and a word line WL, to form the so-called 3-line system. In this configuration, the word line WL controls the access transistor AT even though what is controlled by the word line WL does not have to be a transistor. That is to say, the word line WL can be used for controlling any other element as long as the other element is means for selecting a memory cell MC that includes the means.

Figure 3:
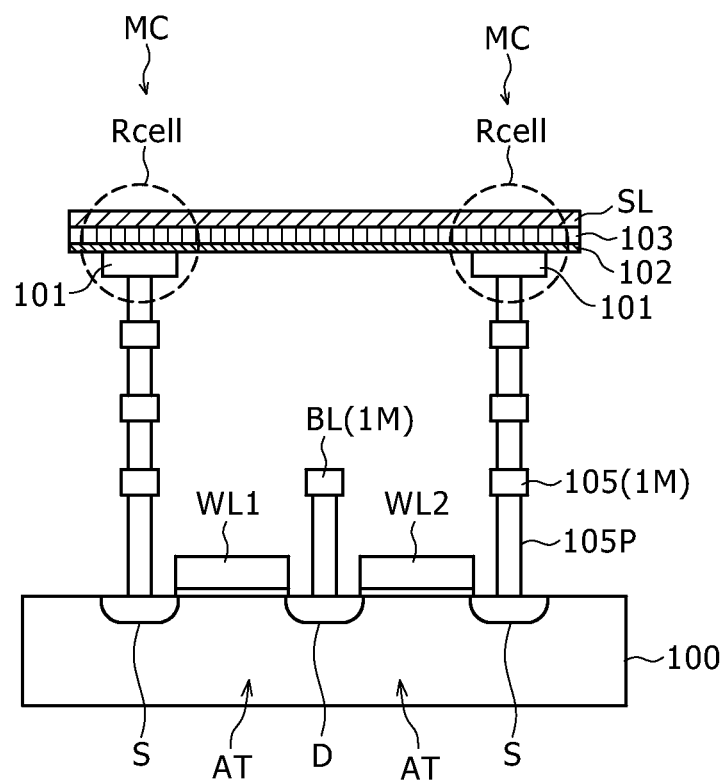
FIG. 3 is a diagram showing a device structure of two adjacent memory cells.

FIG. 3 is a diagram showing a device structure of a portion corresponding to two adjacent memory cells MC. FIG. 3 is a model cross-sectional diagram showing no hatched portion. In addition, FIG. 3 shows white portions not commented in particular. These white portions are each a portion filled up with an insulator film or a part of another configuration portion.

In the memory cell MC shown in FIG. 3, the access transistor AT is created in a semiconductor substrate 100.

In the following description, notation AT is used for denoting any of the access transistors AT1 and AT2 shown in the figure. To put it in detail, the source electrode S of the access transistor AT and the drain electrode D of the access transistor AT are two impurity areas created in the semiconductor substrate 100. A gate electrode is created from a material such as the silicon on a substrate area between the two impurity areas. A gate insulator film is sandwiched by the gate electrode and the substrate area. In this configuration, the gate electrode forms a word line WL1 or WL2 stretched in the row direction which is a direction perpendicular to the paper surface of FIG. 3. The impurity area serving as the drain electrode D as described above is provided between the word lines WL1 and WL2. In addition, on the opposite side of the word line WL, the impurity area serving as the source electrode S is provided. The opposite side of the word line WL is a side opposite to the drain electrode D with respect to the word line WL.

The drain electrode D is connected to the bit line BL, which is created from a first wiring layer 1M, through a bit-line contact. It is to be noted that the bit line BL is actually stretched in a column direction which is the horizontal direction in FIG. 3. However, FIG. 3 does not show the fact that the bit line BL is stretched in the column direction.

On the source electrode S, a plug 105P and a landing pad 105 created from the first wiring layer 1M are piled up repeatedly to form a stack serving as a source-line contact. On the source-line contact, a variable-resistance resistive element Re is created.

The variable-resistance resistive element Re can be created on an xth layer of the multi-layer wiring structure where x is any arbitrary integer. In the case of this configuration, however, the variable-resistance resistive element Re is created on the fourth or fifth layer of the multi-layer wiring structure.

The variable-resistance resistive element Re is typically created as a film configuration or a film laminated body including an insulator film 102 and a conductor film 103 which are provided between a lower electrode 101 and a source line SL serving as an upper electrode.

Typical examples of a material used for making the insulator film 102 include SiN, $SiO_2$ and $Gd_2O_3$.

Typical examples of a material used for making the conductor film 103 include a metallic film, an alloy film such as the CuTe alloy film and a metallic alloy film. The material used for making the conductor film 103 contains at least one selected from metallic elements Cu, Ag, Zr and Al. It is to be noted that any metallic element other than Cu, Ag, Zr and Al may also be used as a material as long as the other metallic element has a property of being ionizable with ease. In addition, the metallic element selected from Cu, Ag, Zr and Al is combined with other elements to produce the material used for making the conductor film 103, and it is desirable to use at least one selected from elements S, Se and Te as the other elements. The conductor film 103 is created as a conductive-ions supplying layer which is a layer for supplying conductive ions.

FIG. 3 shows two variable-resistance resistive elements Re connected to one source line SL. In this configuration, the insulator film 102 serving as the storage layer of the two variable-resistance resistive elements Re, the conductor film 103 serving as the conductive-ions supplying layer of the two variable-resistance resistive elements Re and the source line SL are created in the same layer.

It is to be noted that, in this embodiment, the source line SL is created in a wiring layer which is a layer above the bit line BL. In this configuration, the bit line BL is created in the first wiring layer 1M whereas the source line SL is created in the fourth or fifth wiring layer of the multi-layer wiring structure. It is to be noted that the source line SL can also be created in a wiring layer which is a layer beneath the bit line BL. In either case, the upper layer is the xth layer of the multi-layer wiring structure where x is any arbitrary integer.

Figure 4A:
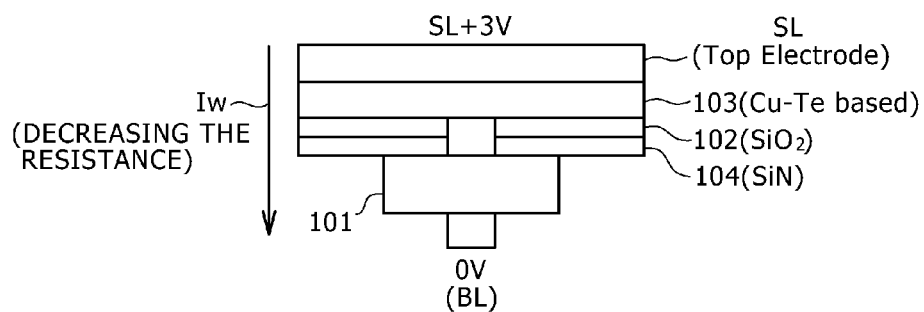
FIGS. 4A and 4B are enlarged diagrams showing a variable-resistance resistive element, the directions of a current flowing through the resistor and typical magnitudes of a voltage applied to the resistor.
Figure 4B:
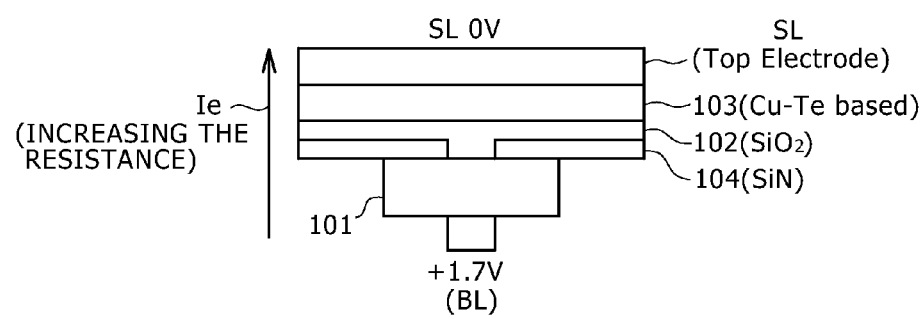

FIGS. 4A and 4B are enlarged diagrams showing the variable-resistance resistive element Re, the directions of a current flowing through the variable-resistance resistive element Re and typical magnitudes of a voltage applied to the variable-resistance resistive element Re.

FIGS. 4A and 4B show a typical configuration in which the insulator film 102 is created from $SiO_2$ and the conductor film 103 is created from a CuTe-based alloy compound. As shown in the figure, the insulator film 102 having a prescribed area of contact with the lower electrode 101 is created at an aperture of a silicon-nitride film 104 which is made from SiN.

In the configuration shown in FIG. 4A, a voltage is applied between the lower electrode 101 and the source line SL serving as the upper electrode in such a direction that the insulator film 102 is put on the negative-electrode side whereas the conductor film 103 is put on the positive-electrode side. For example, the bit line BL is connected to the ground having an electric potential of 0 V whereas the source line SL is set at a typical electric potential of +3 V.

In this state, the metals Cu, Ag, Zr and/or AL contained in the conductor film 103 are ionized, exhibiting a property allowing ions obtained as a result of the ionization to be attracted by the negative-electrode side. That is to say, the conductive ions of these metals are injected into the insulator film 102. Thus, the insulating property of the insulator film 102 deteriorates, causing the insulator film 102 to exhibit conductivity accompanying the deterioration of the insulating property. As a result, a write current Iw flows through the variable-resistance resistive element Re in a direction shown in FIG. 4A. This operation is referred to as a write operation or a set operation.

In the configuration shown in FIG. 4B, on the contrary, a voltage is applied between the lower electrode 101 and the source line SL serving as the upper electrode in such a direction that the insulator film 102 is put on the positive-electrode side whereas the conductor film 103 is put on the negative-electrode side. For example, the source line SL is connected to the ground having an electric potential of 0 V whereas the bit line BL is set at a typical electric potential of +1.7 V.

In this condition, the conductive ions injected into the insulator film 102 are returned back to the conductor film 103, resetting the variable-resistance resistive element Re in the pre-write state in which the resistance of the variable-resistance resistive element Re is high. This operation is referred to as an erase operation or a reset operation. In the reset operation, an erase current Ie flows through the variable-resistance resistive element Re in a direction shown in FIG. 4B.

It is to be noted that, as described above, the set operation is defined as an operation carried out in order to sufficiently inject conductive ions into an insulator film whereas the reset operation is defined as an operation carried out in order to sufficiently pull out conductive ions from the insulator film.

However, a set state obtained as a result of the set operation can be arbitrarily regarded as a state in which data has been written into the memory cell MC or a state in which data has been erased from the memory cell MC. In consequence, a reset state obtained as a result of the reset operation can be arbitrarily regarded as a state in which data has been erased from the memory cell MC or a state in which data has been written into the memory cell MC.

In addition, the set and reset operations can be defined in other words as follows. The set operation is defined as an operation carried out in order to drive the variable-resistance resistive element Re to make a transition from a high-resistance state HRS to a low-resistance state LRS whereas the reset operation is defined as an operation carried out in order to drive the variable-resistance resistive element Re to make a transition from a low-resistance state LRS to a high-resistance state HRS.

In the following description, the state obtained as a result of the set operation is regarded as a state in which data has been written into the memory cell MC whereas, on the other hand, the state obtained as a result of the reset operation is regarded as a state in which data has been erased from the memory cell MC. As described above, the set operation is defined as an operation carried out to reduce the insulation property of the insulator film 102 so as to decrease the resistance of the entire variable-resistance resistive element Re to a sufficiently low level or defined as an operation carried out in order to drive the variable-resistance resistive element Re to make a transition from a high-resistance state HRS to a low-resistance state LRS whereas, on the contrary, the reset operation is defined as an operation carried out to restore the insulation property of the insulator film 102 to the initial property exhibited initially so as to increase the resistance of the entire variable-resistance resistive element Re to a sufficiently high level or defined as an operation carried out in order to drive the variable-resistance resistive element Re to make a transition from a low-resistance state LRS to a high-resistance state HRS.

In FIG. 2A, the direction of the write current Iw is the direction of a current flowing through the variable-resistance resistive element Re in the set operation. In FIG. 2B, on the other hand, the direction of the erase current Ie is the direction of a current flowing through the variable-resistance resistive element Re in the reset operation.

By repeatedly carrying out the set and reset operations described above, the resistance of the variable-resistance resistive element Re can be changed from a large value to a small value and vice versa in a reversible manner, allowing a 2-value memory to be implemented. In addition, even after the voltage applied to the variable-resistance resistive element Re has been removed, the resistance of the variable-resistance resistive element Re does not change or data stored and held in the memory cell MC including the variable-resistance resistive element Re remains the same so that the memory cell MC functions as a cell of a nonvolatile memory.

Nevertheless, the presently disclosed technology can also be applied to a multi-value memory in addition to the 2-value memory. For example, the presently disclosed technology can also be applied to a memory used for storing data having three or more values.

It is to be noted that, in an actual set operation, the resistance of the insulator film 102 changes in accordance with the number of metallic ions injected into the insulator film 102. Thus, the insulator film 102 can be regarded as a storage layer used for storing and holding data.

As described above, a memory cell MC is constructed by making use of this variable-resistance resistive element Re and a memory-cell array of a variable-resistance memory device can be built up by making use of a number of such memory cells MC. The variable-resistance memory device is configured to include this memory-cell array and a peripheral circuit serving as a driving control circuit for driving and controlling the memory-cell array.

Configuration of a Basic Column Circuit and Operations of the Circuit

Figure 5:
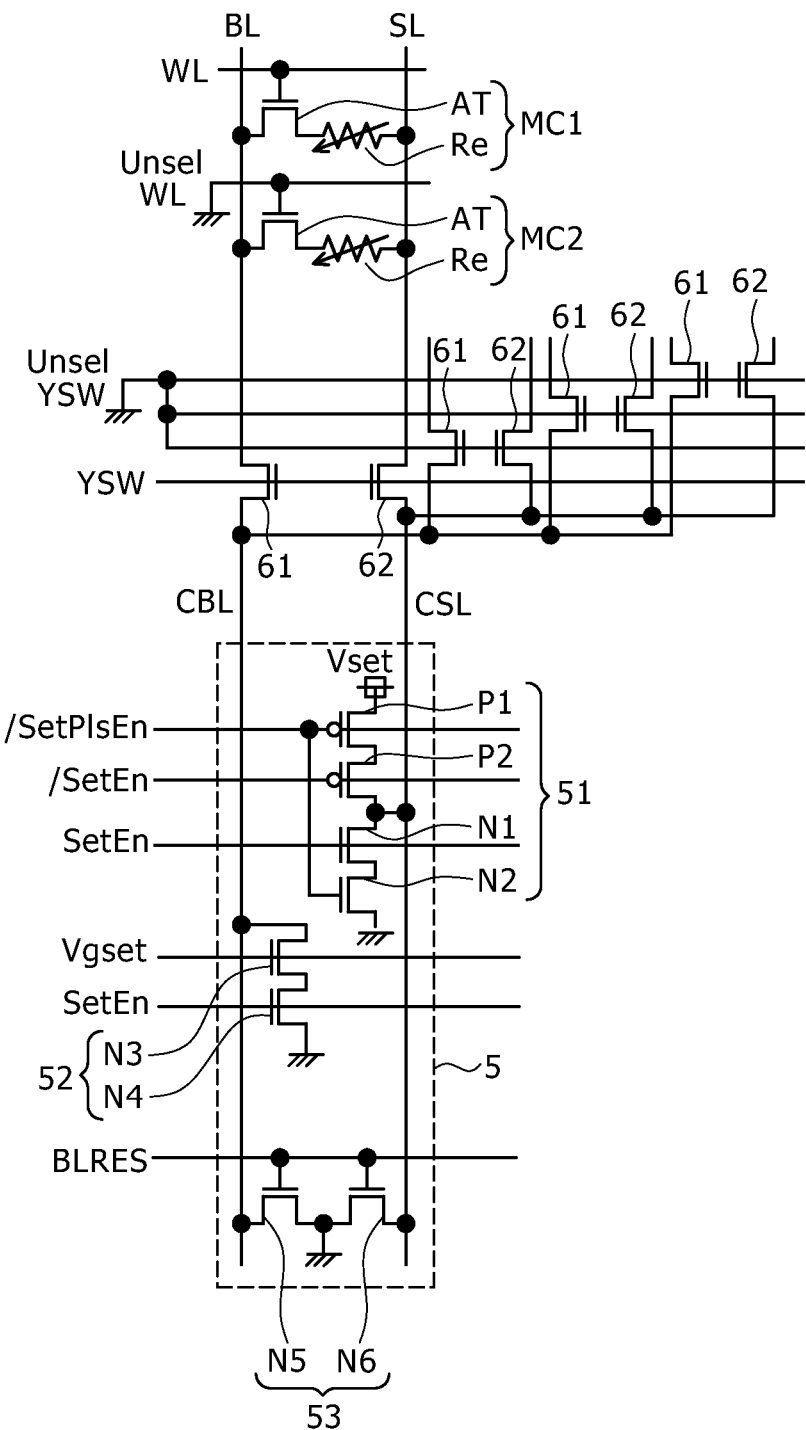
FIG. 5 is a diagram showing the configuration of a basic column circuit.

Next, the configuration of a basic column circuit and operations carried out by the circuit are explained by referring to FIGS. 5 to 6H.

FIG. 5 is a diagram showing the configuration of a column-direction circuit of a memory-cell array. In the following description, this configuration is also referred to as a column circuit configuration.

FIG. 5 shows two memory cells MC1 and MC2 adjacent to each other in the column direction. Much like the configuration shown in FIGS. 2A and 2B, each of the memory cells MC1 and MC2 includes a variable-resistance resistive element Re connected to a source line SL serving as the second common line and an access transistor AT connected between the variable-resistance resistive element Re and a bit line BL serving as the first common line.

The memory cell MC1 is selected by applying a word-line driving pulse to a word line WL connected to the memory cell MC1. As shown in FIGS. 6A to 6H, the word-line driving pulse is denoted by the same notation WL as the word line. On the other hand, a word line WL connected to the memory cell MC2 is put in the state of being unselected as indicated by notation Unsel WL in the same figure. In this case, the word line WL connected to the memory cell MC2 is connected to the ground.

The source line SL and the bit line BL form a pair referred to as a common-line pair in the following description. It is to be noted that the common-line pair is also connected to a number of memory cells MC other than the memory cells MC1 and MC2. However, the other memory cells MC are not shown in FIG. 5. In the same way as the memory cell MC2, the other memory cells MC not shown in FIG. 5 are connected to the ground and put in the state of being unselected.

In addition to the common-line pair shown in FIG. 5 as a pair consisting of the bit line BL and the source line SL, the memory-call array is configured to include a number of other common-line pairs each having the same configuration as the pair shown in FIG. 5.

The column-circuit configuration is put in a structure wherein a plurality of common-line pairs share a driving control circuit serving as a set driver 5 having a voltage driver 51 used as a voltage driving section and a current control section 52 of the bit line.

Thus, it is necessary to provide a configuration for selecting one of the common-line pairs sharing the driving control circuit and connecting the selected common-line pair to the driving control circuit.

To explain it in more detail, each common-line pair is provided with a select transistor 61 for selecting the bit line BL and a select transistor 62 for selecting the source line SL. The select transistor 61 and the select transistor 62 form a select-transistor pair (61, 62). The select-transistor pair (61, 62) is provided for each of the common-line pairs sharing the driving control circuit. FIG. 5 shows four select-transistor pairs (61, 62).

The select-transistor pair (61, 62) shown in FIG. 5 includes two NMOS transistors. In order to select the select-transistor pair (61, 62), it is necessary to apply a positive select signal YSW to the gate electrode of each of the NMOS transistors. On the other hand, the gate electrode of each of the NMOS transistors in every other select-transistor pairs (61, 62) which are not selected is connected to the ground.

In the following description, a common bit line connected to the bit line BL by the select transistor 61 is referred to as a common bit line CBL. By the same token, a common bit line connected to the source line SL by the select transistor 62 is referred to as a common source line CSL.

The set driver 5 serving as the driving control circuit has a voltage driver 51 connected to the common source line CSL to be used as a voltage driving section, a current control section 52 connected to the common bit line CBL and a reset section 53.

It is to be noted that the technical term 'reset' used in the technical term 'reset section 52' does not mean either of the erase operation and the resistance increasing operation which have been explained earlier. Instead, this technical term 'reset' simply means an inoperative state or the so-called standby state. In the following description, the technical term 'reset' is used to imply the standby state.

The voltage driver 51 has two PMOS transistors P1 and P2 as well as two NMOS transistors N1 and N2.

A common drain electrode shared by the PMOS transistor P1 and the NMOS transistor N1 is connected to the common source line CSL. The PMOS transistor P1 is connected between the source electrode of the PMOS transistor P2 and a line for supplying a positive set voltage Vset. The NMOS transistor N2 is connected between the source electrode of the NMOS transistor N1 and a line for supplying the ground electric potential.

A set enable signal SetEn is supplied to the gate electrode of the NMOS transistor N1 whereas the inverted signal /SetEn of the set enable signal SetEn is supplied to the gate electrode of the PMOS transistor P2.

The inverted signal /SetPlsEn of a set pulse enable signal SetPlsEn is supplied to the gate electrode of each of the PMOS transistor P1 and the NMOS transistor N2.

The current control section 52 has two NMOS transistors N3 and N4 connected to each other in series between the common bit line CBL and the line for supplying the ground electric potential.

A set gate voltage Vgset for current control is supplied to the gate electrode of the NMOS transistor N3. The gate electrode of the NMOS transistor N4 is controlled by the set enable signal SetEn cited above.

The reset section 53 has two NMOS transistors N5 and N6 connected to each other in series between the common bit line CBL and the common source line CSL. A connection point connecting the two NMOS transistors N5 and N6 to each other in series is connected to the ground. The gate electrode of each of the two NMOS transistors N5 and N6 is controlled by a reset signal BLRES.

Next, before operations carried out in the column-circuit configuration shown in FIG. 5 are explained by referring to FIGS. 6A to 6H, the fundamentals of the set operation are described by referring to FIG. 7.

Figure 7A:
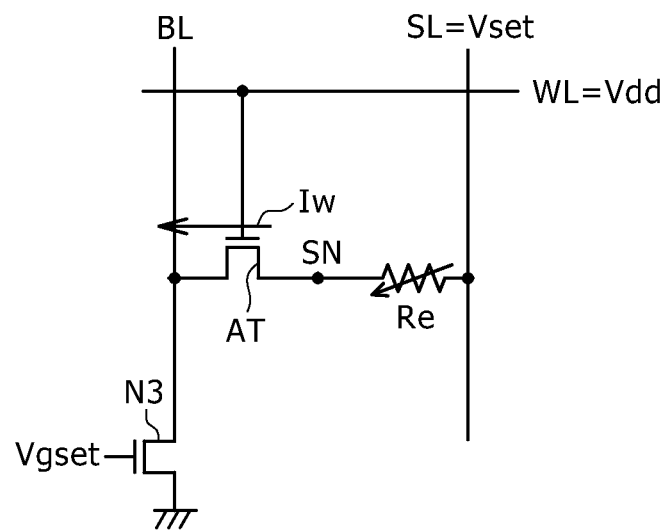
FIGS. 7A and 7B are explanatory diagrams to be referred to in description of a set operation.

The set operation also referred to as a resistance reduction operation is started from a standby state by applying a positive set voltage Vset to the source line SL. In the standby state, both the bit line BL and the source line SL are connected to the ground. When the set operation is started, a power-supply voltage Vdd has been applied to the word line WL. Thus, an element current is flowing through the variable-resistance resistive element Re in a direction indicated by an arrow as shown in FIG. 7A. In this case, the element current is the write current Iw. It is to be noted that, in the following description, the write current Iw is also referred to as a set current.

Figure 7B:
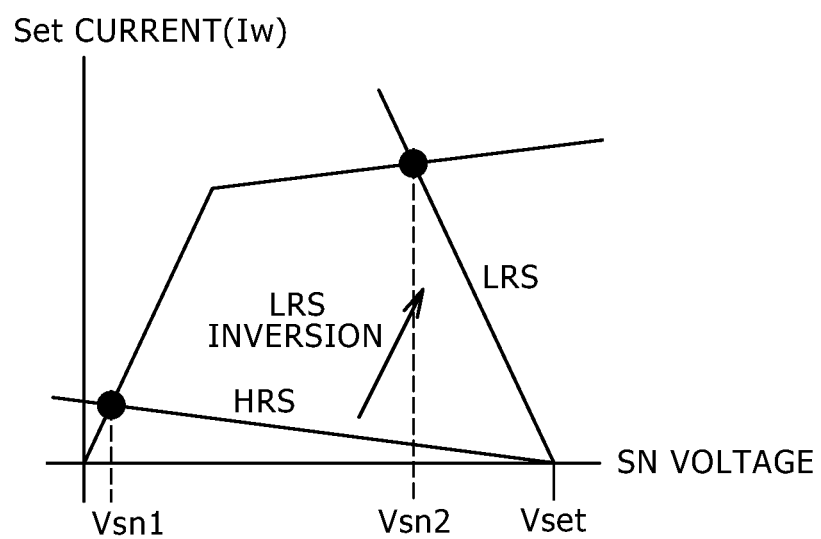

FIG. 7B is a diagram showing straight lines HRS and LRS representing characteristics of a load imposed by the variable-resistance resistive element Re on the access transistor AT and a saturation characteristic line representing the relation between a voltage applied to the drain electrode of the access transistor AT and a current flowing through the drain electrode in a state in which the power-supply voltage is applied to the word line WL to open the channel of the access transistor AT. The load straight lines HRS and LRS are superposed on the saturation characteristic line.

As shown in FIG. 7A, a node between the variable-resistance resistive element Re and the access transistor AT serves as a storage node SN. The horizontal axis of FIG. 7B represents an SN voltage taking the electric potential of the grounded bit line BL as a reference. The SN voltage is a voltage applied to the drain electrode of the access transistor AT. On the other hand, the vertical axis of FIG. 7B represents the set current which is a current flowing through the drain electrode of the access transistor AT.

Before the set operation is started, typically, the power-supply voltage Vdd is applied to the word line WL, turning on the access transistor AT. Thus, the storage node SN is short-circuited to the bit line BL so that an electric potential appearing at the storage node SN is all but the same as an electric potential appearing on the bit line BL. In the following description, the electric potential appearing at the storage node SN and the electric potential appearing on the bit line BL are referred to as an SN electric potential and a BL electric potential respectively. At that time, the source line SL is grounded so that only an extremely low voltage is applied to the variable-resistance resistive element Re, putting the variable-resistance resistive element Re in an all but stress-free state. In addition, a voltage applied between the source and drain electrodes of the access transistor AT is also very low so that the access transistor AT operates in an unsaturated region or does not allow a current to flow.

The set operation is started in this state, causing a voltage appearing on the source line SL to rise to the set voltage Vset. When the set operation is started, the resistance of the variable-resistance resistive element Re is in a high-resistance state HRS. Thus, the load straight line HRS has a small gradient as shown in FIG. 7B. For a certain period of time elapsing since the start of the set operation, the first storage-node voltage Vsn1 is extremely low. It is to be noted that the first storage-node voltage Vsn1 is a voltage at the operating point which is an intersection of the load straight line HRS shown in FIG. 7B and the saturation characteristic line. Thus, a large voltage of (Vset−Vsn1) is applied to the variable-resistance resistive element Re, exposing the variable-resistance resistive element Re to a voltage stress. At that time, the BL electric potential is equal to (Vset−Iset×Rcell) and, since the cell resistance Rcell is extremely large, the BL electric potential has a value close to a reference voltage Vss which is the GND electric potential of 0 V. Thus, a voltage applied to the variable-resistance resistive element Re is a large voltage close to the set voltage Vset.

As the time period having a certain length elapses since the start of the set operation, the variable-resistance resistive element Re makes a transition from the high-resistance state HRS to a low-resistance state LRS. This transition is referred to as an LRS inversion shown in FIG. 7B. When the LRS inversion occurs, the gradient of the load straight line increases all of a sudden from the gradient of the load straight line HRS to the gradient of the load straight line LRS, causing the operating point to move to a saturated region. At that time, the voltage at the operating point also makes a transition from the small first storage-node voltage Vsn1 to a large second storage-node voltage Vsn2. Thus, after the LRS inversion, the SN electric potential Vsn2 shown in FIG. 7B to represent the voltage at the operating point is the second storage-node voltage Vsn2 expressed as follows: Vsn2=(Iset×RLRS). As is obvious from this equation, the second storage-node voltage Vsn2 is the product of the set current Iset flowing through the variable-resistance resistive element Re after the LRS inversion and the resistive-element resistance RLRS in the low-resistance state LRS. In the low-resistance state LRS, a voltage of (Vset−Vsn2) is applied to the variable-resistance resistive element Re.

In accordance with the bit-line current driving method, as shown in FIG. 7A, the NMOS transistor N3 with its gate electrode receiving the set gate voltage Vgset effectively exists between the bit line BL and a generator of the ground electric potential as also shown in FIG. 5.

Now, assume a case in which the NMOS transistor N3 is not used. In such a case, the bit line BL is put in a state of being connected permanently to the generator of the ground electric potential. In this case, if there are variations of the characteristic of the variable-resistance resistive element Re serving as the variable-resistance storage element, the operating points also move. As a result, there are also undesirable variations of the magnitude of the set current.

In accordance with the bit-line current driving method, on the other hand, an electric potential appearing at the drain electrode of the NMOS transistor N3 or an electric potential appearing on the bit line BL is changed so that a current flowing through the bit line BL has a constant magnitude. In this case, the current flowing through the bit line BL is the write current Iw or the set current. Thus, even if there are variations of the characteristic of the variable-resistance resistive element Re, the current flowing through the bit line BL has a constant magnitude in the saturated region.

After the LRS inversion, an electric potential appearing on the source line SL is restored to the original ground electric potential to terminate the set operation.

The set operation explained so far is described again from a circuit-operation viewpoint by referring to the timing charts shown in FIGS. 6A to 6H as follows. It is to be noted that, in the following description, circuit-element reference notations shown in FIG. 5 are properly used.

The state before a time t0 shown in FIGS. 6A to 6H is a standby state. In the standby state, as shown in FIGS. 6A to 6E, a variety of (pulse) signals used in the configuration shown in FIG. 5 are set at a predetermined H (high) level or a predetermined L (low) level.

To put it concretely, the access transistor AT is turned off by WL=L whereas the select transistors 61 and 62 are turned off by YSW=L. In addition, the bit line BL and the source line SL are disconnected from the common bit line CBL and the common source line CSL respectively. On top of that, with BLRES=H, the common bit line CBL is connected to the ground by the NMOS transistor N5 put in a turned-on state. On the other hand, the common source line CSL is connected to the ground by the NMOS transistor N6 put in a turned-on state. Furthermore, because of SetEn=L, the voltage driving operation carried out by the voltage driver 51 is deactivated.

At that time, the set gate voltage Vgset shown in FIG. 6F is set at a certain level by a control circuit not shown in FIG. 5. Because of SetEn=L, however, the NMOS transistor N4 is turned off and the bit-line current control executed by making use of the NMOS transistor N3 is not working or is not effective.

As shown in FIGS. 6G and 6H, in the standby state, the electric potentials of the common bit line CBL, the common source line CSL and other lines are put at a ground electric potential GND which is the electric-potential level of the ground so that no element current is flowing through the variable-resistance resistive element Re.

At the time t0, a variety of signals shown in FIGS. 6A to 6D are inverted.

Thus, the standby state is ended and the common bit line CBL as well as the common source line CSL which were connected to the ground are disconnected from the ground.

The column switch enters a conductive state, connecting the bit line BL to the common bit line CBL and the source line SL to the common source line CSL.

The access transistor AT is put in a conductive state.

In addition, in the voltage driver 51, the NMOS transistor N1 and the PMOS transistor P2 are put in a turned-on state. Since SetPlsEn=L is sustained as shown in FIG. 6E, however, the operation to drive the source line SL has not been carried out by the voltage driver 51 yet.

On top of that, the NMOS transistor N4 employed in the current control section 52 is put in a turned-on state, setting a valid period in which the bit-line control making use of the NMOS transistor N3 can be executed.

As described above, by inverting a variety of signals at the time t0, the preparation for a set operation can be completed.

The set operation also referred to as a resistance reduction operation is started at a time t1 after the time t0. At the time t1, the set pulse enable signal SetPlsEn is raised from the L level to the H level. Thus, due to a driving operation carried out by the voltage driver 51, the SL electric potential appearing on the source line SL is raised to the set voltage Vset. As a result, as shown in FIG. 6G, the SL electric potential and the CSL electric potential appearing on the common source line CSL change from the ground electric potential GND to the set voltage Vset at the same time.

The inversion of the SL electric potential is carried out by the voltage driver 51. As indicated by the load straight line HRS shown in FIG. 7B, the memory cell MC is in the high-resistance state HRS so that the set driver 5 is operating in a linear region and the BL electric potential is represented by the following expression: (Vset−Iset×RHRS)≈Vss (GND). Thus, the variable-resistance resistive element Re is exposed to a big voltage stress close to the set voltage Vset. Then, after a while, the LRS inversion occurs at a time t2. These operations have already been explained before by referring to FIGS. 7A and 7B.

A time period t shown in FIG. 6G as a period between the times t1 and t2 represents a stress application time period ended by the occurrence of the LRS inversion. The stress application time period is an effective write time period. In this way, in a variable-resistance storage element such as the variable-resistance storage element having the configuration shown in FIGS. 4A and 4B, application of a voltage which is large to a certain degree causes metallic ions to start moving, resulting in a resistance-state transition.

When the LRS inversion occurs at the time t2, the bit-line current control is executed by making use of the NMOS transistor N3 employed in the current control section 52 in order to control the BL electric potential so that the bit-line current is sustained at a constant magnitude. The bit-line current is the element current or the set current Iset. As a result of the bit-line current control, as shown in FIG. 6G, the BL electric potential is set at a level higher than the ground electric potential GND but lower than the set voltage Vset. This level varies adaptively from memory cell to memory cell so that the set current Iset is sustained at a constant magnitude even if there are variations of the characteristic of the variable-resistance resistive element Re from memory cell to memory cell. In addition, by properly setting the set gate voltage Vgset applied to the gate electrode of the NMOS transistor N3, the set current Iset can be controlled to a desired magnitude.

At that time, a voltage of (Iset×RLRS) is applied to the variable-resistance resistive element Re as shown in FIG. 6G.

In this case, as shown in FIGS. 4A and 4B, the magnitude of the set current Iset can be used for executing control of adjusting the LRS resistance RLRS. This control is the bit-line current control according to the embodiments of the presently disclosed technology. By execution of this control, it is possible to obtain a desired LRS resistance RLRS determined by the level of a set gate voltage Vgset applied to the gate electrode of the NMOS transistor N3 shown in FIG. 5.

Thus, it is possible to implement a narrow LRS-resistance distribution in a number of memory cells MC. In addition, it is also possible to implement a multi-value memory capable of storing data having a large bit count greater than 2.

If the presently disclosed technology is not applied, however, there will be demerits described as follows.

In the operation sequence shown in FIGS. 6A to 6H as a sequence of operations carried out in the configuration shown in FIG. 5, the set pulse enable signal SetPlsEn is restored to the L level later at a time t4. Thus, the electric potentials appearing on the source line SL and the bit line BL are lowered back to the initial ground electric potential GND. At this time, the set operation also referred to as the resistance reduction operation is ended.

Immediately before the end of the set operation, however, the BL electric potential is set at a level higher than the ground electric potential GND but lower than the set voltage Vset in order to carry out the bit-line current control. Thus, when the SL electric potential is driven back to the L level at the end of the set operation, it is feared that electric charge accumulated on the bit line BL flows through the memory cell MC in the reset direction also referred to as an erase direction. A negative instantaneous current Ireset generated at the time t4 in the element-current waveform shown in FIG. 6H is the aforementioned electric-charge current flowing in the reset direction at the end of the set operation.

In accordance with the presently disclosed technology, by adding an equalize section separately as will be described later, basically, it is possible to solve the problem as to how the generation of the current flowing in the reset direction can be avoided.

By making use of the reset section 53, however, the generation of the current flowing in the reset direction can be avoided or, even if such a current is generated, the magnitude of the current can be reduced. In this case, the reset signal BLRES restored to the H level at a time t6 as shown in FIG. 6A is restored at the time t4 or prior to the time t4 to the H level after the current control following the LRS inversion has been completed. Thus, remaining residual electric charge at the BL electric potential is electrically discharged through a path different from the memory cell MC. As a result, no current flows in the reset direction or, even if such a current flows, the magnitude of the current can be reduced.

If the timing of the reset signal BLRES is changed as described above, the end timing of the set operation can be determined by an equalize process carried out by the reset section 53 which serves as the equalize section. In this case, the reset section 53 functions also as the equalize section according to the embodiments of the presently disclosed technology.

Figure 8:
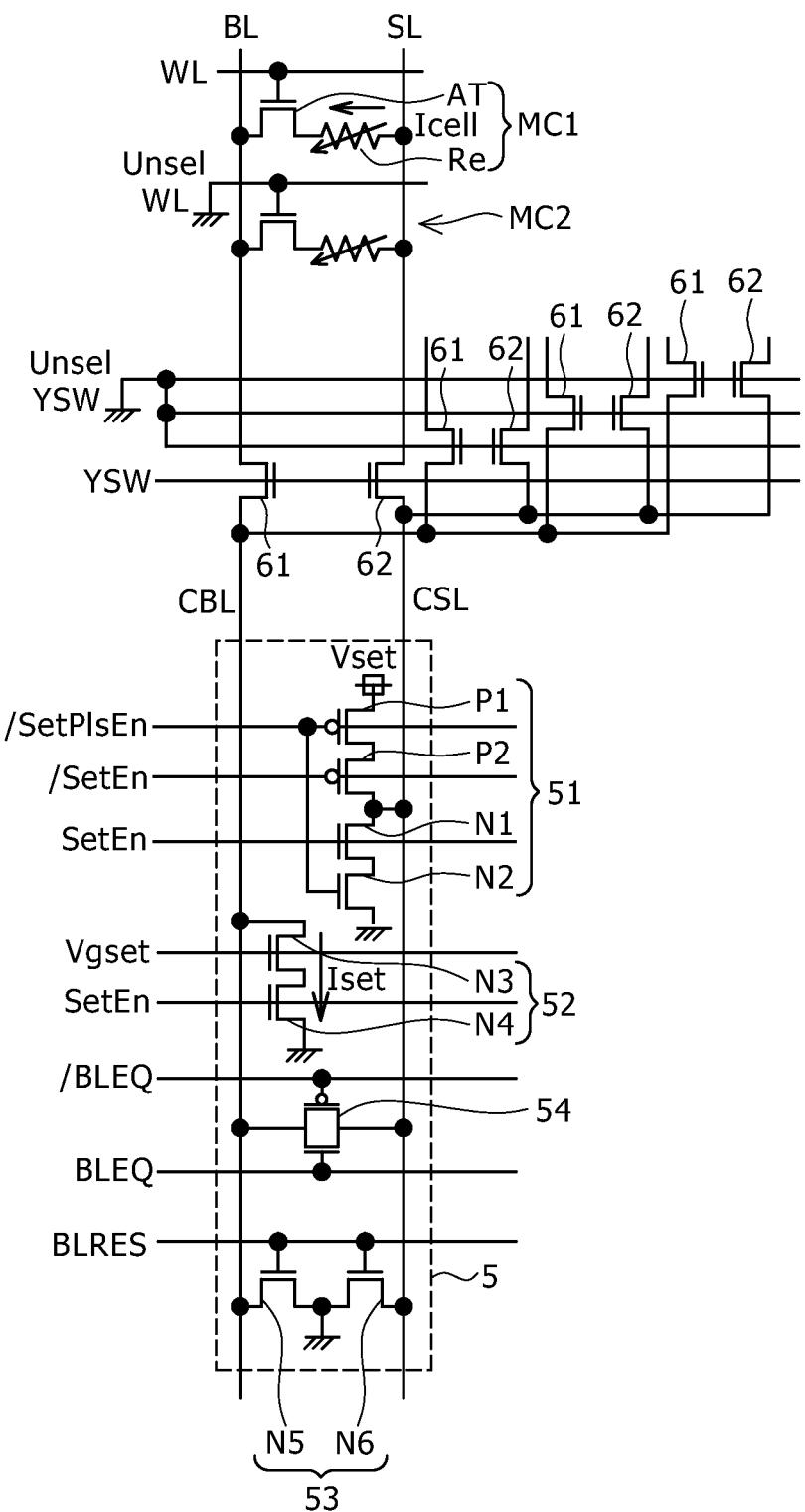
FIG. 8 is a diagram showing the configuration of a column circuit having a circuit element as its load.

Configuration of the Column Circuit with an Additional Circuit Element and Operations of the Circuit Next, the following description explains the configuration of a column circuit having an additional circuit element and operations carried out by the circuit. FIG. 8 is a diagram showing the configuration of a column circuit obtained by adding a circuit element to the basic configuration shown in FIG. 5.

The configuration shown in FIG. 8 is obtained by adding a short-circuit switch 54 serving as an equalize section to the basic configuration shown in FIG. 5. As shown in FIG. 8, the short-circuit switch 54 is connected between the common bit line CBL and the common source line CSL. The rest of the configuration shown in FIG. 8 is identical with the configuration shown in FIG. 5. In addition, operations carried out in the rest of the configuration shown in FIG. 8 are also the same as those carried out in the configuration shown in FIG. 5. That is to say, the explanation of the configuration shown in FIG. 5 and the operations carried out in the configuration holds true as it is for respectively the rest of the configuration shown in FIG. 8 as a remaining configuration excluding the short-circuit switch 54 and operations carried out in the rest of the configuration.

In the configuration shown in FIG. 8, the short-circuit switch 54 is configured as a transmission gate TG including NMOS and PMOS transistors having their source electrodes connected to each other and their drain electrodes also connected to each other as well.

In the short-circuit switch 54, an equalize signal BLEQ is supplied to the gate electrode of the NMOS transistor whereas the inverted signal /BLEQ of the equalize signal BLEQ is supplied to the gate electrode of the PMOS transistor. It is to be noted that the inverted signal /BLEQ of the equalize signal BLEQ can be typically obtained by inverting the equalize signal BLEQ by making use of an inverter employed in the short-circuit switch 54 but not explicitly shown in FIG. 8.

FIGS. 9A to 9H are diagrams showing timing charts (or operation waveforms) of signals in the configuration shown in FIG. 8.

Figure 9:
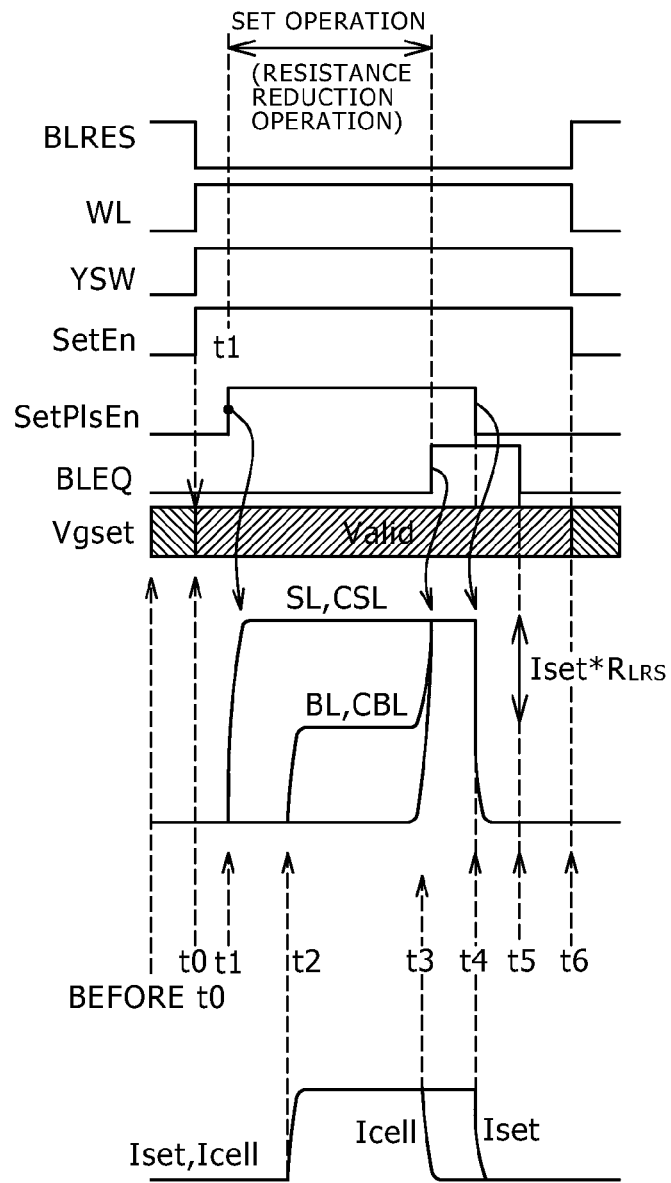
FIGS. 9A to 9H are diagrams showing operation waveforms of signals in the configuration of the column circuit having a circuit component as its load.

FIGS. 9A to 9H are different from FIGS. 6A to 6H in that FIGS. 9A to 9H include additional FIG. 9E1 which is a diagram showing the pulse waveform of the equalize signal BLEQ.

The equalize signal BLEQ rises from the L level to the H level at the time t3 preceding the time t4 at which the set operation is ended in the case of the operation waveforms shown in FIGS. 6A to 6H. Then, the equalize signal BLEQ is restored from the H level back to the L level at a time t5 following the time t4.

By adding an equalize operation with such a timing, at the time t3, the short-circuit switch 54 for short-circuiting the bit line BL and the source line SL conducts at an impedance sufficiently lower than the resistance of the memory cell MC. Thus, at the time t3 serving as the start time of the equalize operation, the electric potential appearing on the bit line BL soon becomes equal to the electric potential appearing on the source line SL. As a result, a voltage applied to the variable-resistance resistive element Re is removed or becomes equal to 0 V, ending the set operation. Characteristics of the presently disclosed technology include the termination of the set operation also referred to as the resistance reduction operation carried out by making the electric potential appearing on the bit line BL used as the first common line equal to the electric potential appearing on the source line SL used as the second common line in this way.

It is to be noted that the rising timing of the equalize signal BLEQ can also be made all but coincident with the time t4. The term 'all but coincident' means that the rising timing of the equalize signal BLEQ is permitted to lag behind the time t4 a little bit. That is to say, the rising timing of the equalize signal BLEQ may lag behind the time t4 slightly if the equalize operation carried out by making use of the short-circuit switch 54 functions effectively before the voltage driver 51 pulls down the source line SL to the ground electric potential GND. In this case, since the equalize operation functions effectively before the source line SL is pulled down to the ground electric potential GND, the equalize operation prescribes the end timing of the set operation.

As shown in FIGS. 9A to 9H, the BL electric potential and the SL electric potential are pulled down to the ground electric potential GND at the time t4. At the time t4, however, the equalize operation has terminated the set operation. Thus, the operation to pull down the BL electric potential and the SL electric potential to the ground electric potential GND at the time t4 is carried out merely as an operation to restore the electric potentials appearing on the bit line BL and the source line SL back to the level in the initial state which is the standby state. It is desirable to take a time t5 following the time t4 as a timing with which the equalize signal BLEQ is restored from the H level back to the L level as shown in the figure. However, the equalize signal BLEQ can also be restored from the H level back to the L level at about the same time as the time t4.

Later on, at a time t6, all signals are restored to the initial state which is the standby state.

If the control described above is executed, as is obvious from the operation waveform shown in FIG. 9H, the element current does not flow in the reset direction at the time t4 so that the disturbance described before can be avoided.

Block Configuration of the Entire Memory

Figure 10:
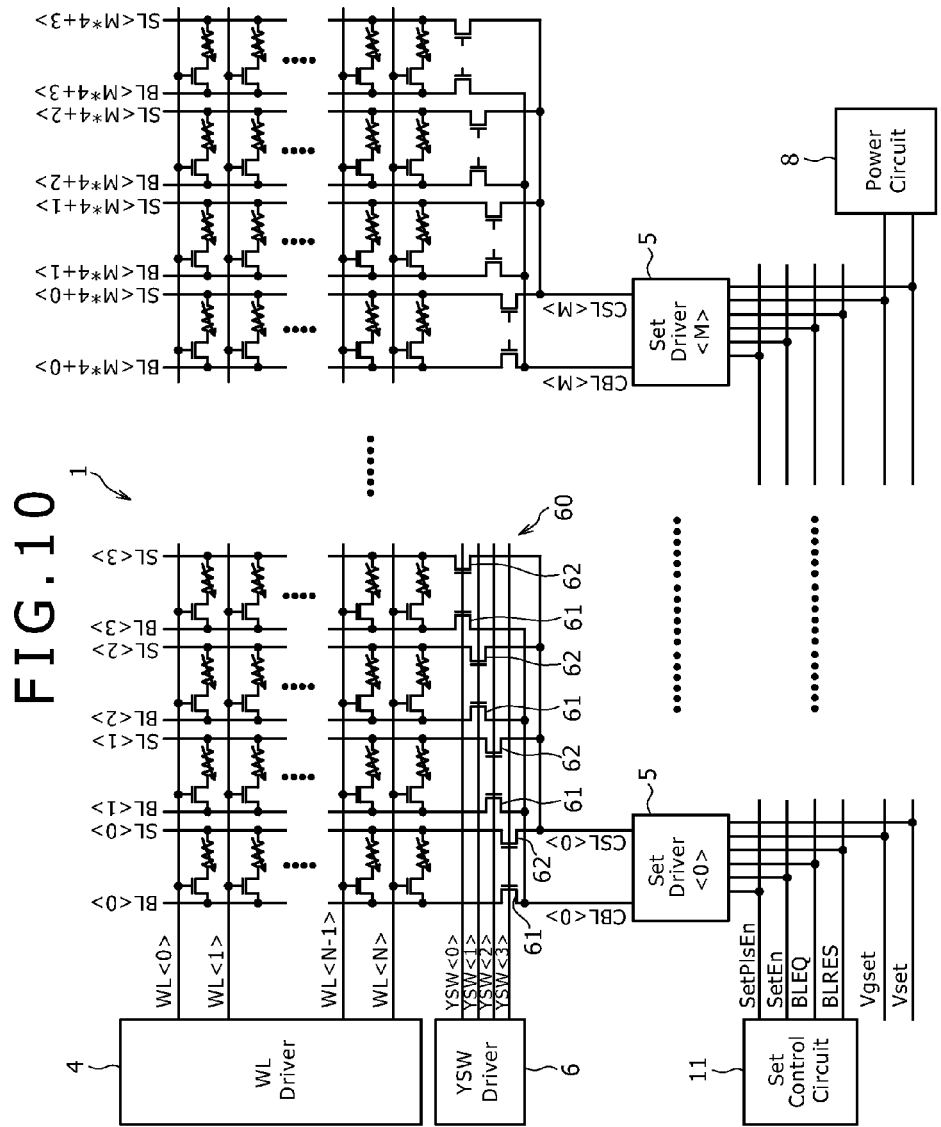
FIG. 10 is a circuit block diagram showing a memory device.

FIG. 10 is a circuit block diagram showing a typical block configuration of the entire variable-resistance memory device. As shown in FIG. 10, the variable-resistance memory device includes a memory array 1 and principal elements employed in a peripheral circuit provided for the memory array 1. The memory array 1 has a number of 1T-1R memory cells MC laid out to form a matrix. As shown in the figure, the principal elements employed in the peripheral circuit include a WL driver 4, set drivers 5, a YSW driver 6, YSW sections 60, a power-supply circuit 8 and a set control circuit 11.

The variable-resistance memory device shown in the figure adopts a method in which the set driver 5 is provided for every four memory-cell columns. The set driver 5 is connected to a common bit line CBL and a common source line CSL which are two common lines shared by the four memory-cell columns for which the set driver 5 is provided. The common bit line CBL and the common source line CSL form a common-line pair (CBL, CSL) for the four memory-cell columns. The YSW section 60 controls connection of the four memory-cell columns to the common-line pair (CBL, CSL). The YSW section 60 includes four select-transistor pairs associated with the four memory-cell columns respectively. Each of the four select-transistor pairs consists of the select transistors 61 and 62 shown in FIGS. 5 and 8. The connection control executed by the YSW section 60 is ¼ MUX switching of selecting one pair from four (BL, SL) pairs as a pair to be connected to the common-line pair (CBL, CSL). A (BL, SL) pair provided for each memory-cell column consists of the bit line BL and the source line SL which are provided for the memory-cell column.

The YSW driver 6 generates select four signals YSW <0> to YSW<3> for respectively the four select-transistor pairs provided for every YSW section 60. As described above, each of the four select-transistor pairs consists of the select transistors 61 and 62.

In addition, the memory array 1 also includes (N+1) word lines WL<0> to WL<n>. The WL driver 4 selects one of the word lines WL<0> to WL<n> as a word line to be driven to typically the power-supply voltage Vdd.

In this typical configuration adopting the ¼ MUX switching method as described above, the number of set drivers 5 is equal to only (¼) of the number of memory-cell columns.

Accordingly, there is a margin in the space allocated to the set drivers 5. As a result, allocation of the space can be made efficient so that the area occupied by peripheral circuit can be reduced.

Each of the set drivers 5 has the circuit configuration shown in FIG. 5 or 8. The set control circuit 11 employed in the variable-resistance memory device generates four different signals necessary for the set driver 5. The four signals necessary for the set driver 5 are the set pulse enable signal SetPlsEn, the set enable signal SetEn, the equalize signal BLEQ and the reset signal BLRES. Since the first three signals (that is, the set pulse enable signal SetPlsEn, the set enable signal SetEn and the equalize signal BLEQ) are inverted, the set control circuit 11 generates a total of seven different signals which includes the three inverted signals.

The power-supply circuit 8 generates the set voltage Vset and the set gate voltage Vgset. In FIG. 10, the power-supply circuit 8 is shown as a block referred to as a power circuit.

The set control circuit 11 can be implemented as a portion of an overall control circuit for executing overall control of all blocks included in the variable-resistance memory device. Thus, such a portion carries out only some functions of the overall control circuit not shown in FIG. 10. As an alternative, the set control circuit 11 can also be implemented as a partial control circuit controlled by the overall control circuit.

In addition, in accordance with control carried out by the overall control circuit not shown in the figure or the set control circuit 11, the power-supply circuit 8 may execute control to change the set gate voltage Vgset. Thus, it is possible to implement a variable-resistance memory device capable of changing the set current Iset so as to obtain a desired LSR resistance.

2: Second Embodiment

Figure 11:
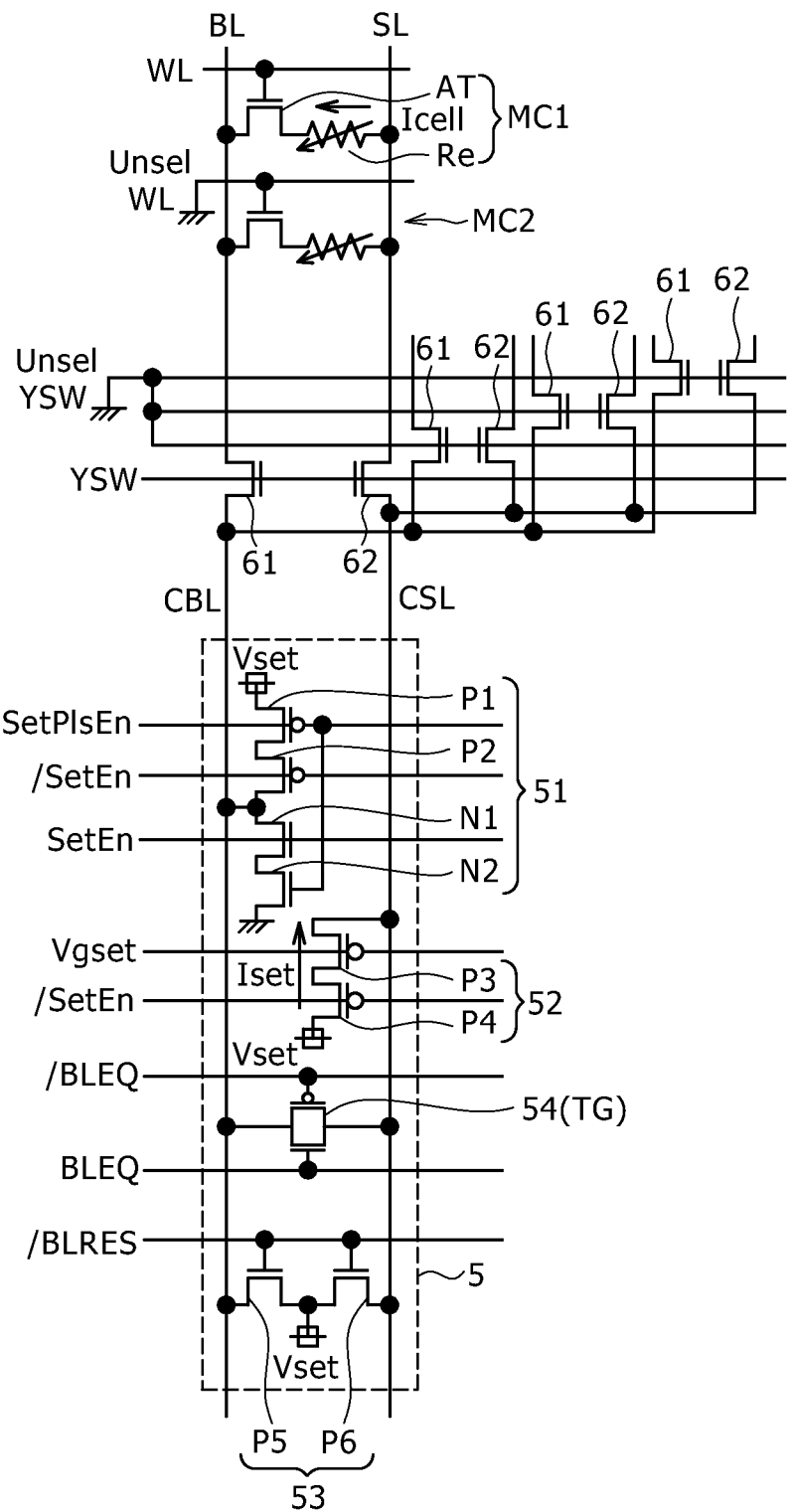
FIG. 11 is a diagram showing the configuration of a column circuit according to a second embodiment.

FIG. 11 is a diagram showing the configuration of a column circuit according to a second embodiment whereas FIGS. 12A to 12H are diagrams showing operation waveforms (or timing charts) of signals in the configuration of the column circuit according to the second embodiment.

In the case of the first embodiment described so far, the bit line BL is used as the first common line whereas the source line SL is used as the second common line. In the case of the second embodiment, on the other hand, the bit line BL is used as the second common line whereas the source line SL is used as the first common line.

In either case, the second common line is defined as a line, an electric potential appearing on which is changed at the start of the resistance reduction operation. On the other hand, the first common line is defined as a line, an electric potential appearing on which is adjusted in order to control a current flowing through the storage element during the resistance reduction operation.

In order to implement the embodiment modifications described above, as shown in FIG. 11, the voltage driver 51 is connected to the side on which the bit line BL is provided. That is to say, the voltage driver 51 is connected to the common bit line CBL. On the other hand, the current control section 52 is connected to the side on which the source line SL is provided. That is to say, the current control section 52 is connected to the common source line CSL.

The signal supplied to the voltage driver 51 is changed from the set pulse enable signal SetPlsEn to its inverted signal /SetPlsEn. In addition, the current control section 52 is changed to two PMOS transistors P3 and P4 connected in series between the common source line CSL and a line for supplying the set voltage Vset.

The embodiment modifications described above are needed because the BL electric potential in the standby state is changed from the ground electric potential GND to the set voltage Vset, the set operation is started by pulling down the BL electric potential from the set voltage Vset to the ground electric potential GND and the BL electric potential is restored to the set voltage Vset from the ground electric potential GND after the set operation has been ended.

In addition, in order to implement the modification of the standby-state BL electric potential, the reset section 53 is changed to PMOS transistors P5 and P6 for supplying the set voltage Vset. Thus, the control signal for controlling the PMOS transistors P5 and P6 is changed to the inverted signal of the control signal for the reset section 53 employed in the first embodiment.

Figures 12A, 12B, 12C, 12D, 12E, 12F, 12G, 12H:
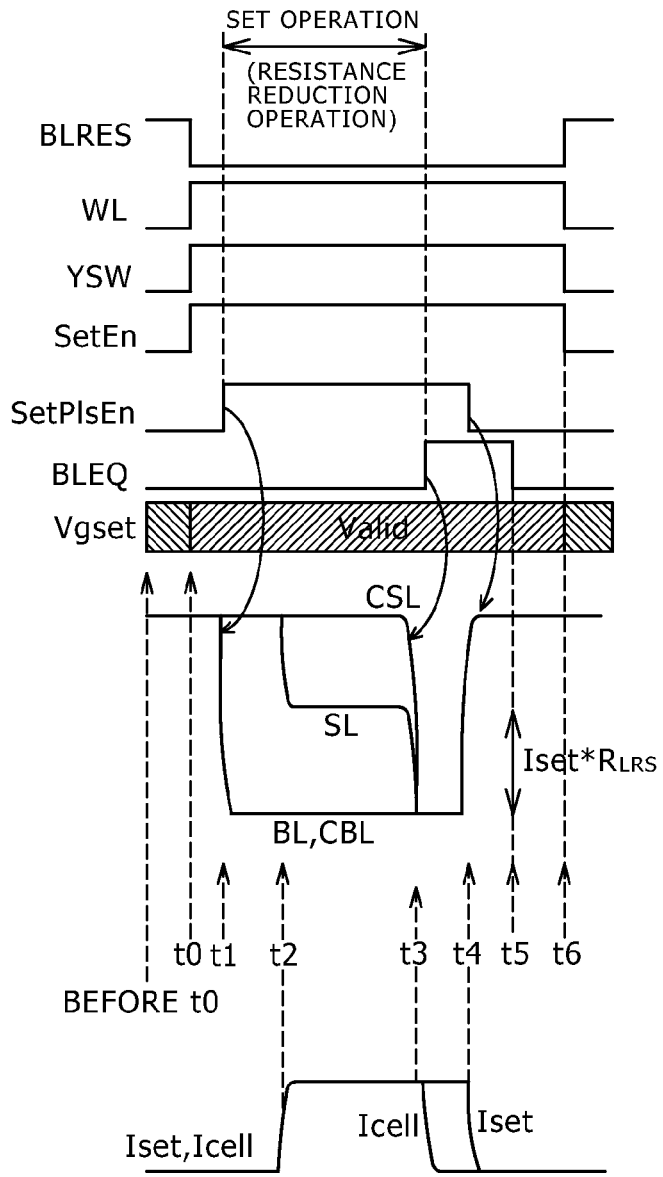
FIGS. 12A to 12H are diagrams showing operation waveforms of signals in the configuration of the column circuit according to the second embodiment.

In this case, operation waveforms shown in FIGS. 12A to 12H are obtained. It is to be noted that the operation waveforms shown in FIGS. 12A to 12E are the same as the operation waveforms shown in FIGS. 9A to 9E respectively. As shown in FIG. 11, however, the signal actually supplied to the reset section 53 is a signal /BLRES which is the inverted signal of the reset signal BLRES whose operation waveform is shown in FIG. 12A.

Differences between FIGS. 9A to 9H and FIGS. 12A to 12H include a difference in operation waveform between FIGS. 9G and 12G. In the case of the second embodiment, the set operation is started by changing the electric potential appearing on the bit line BL used as the second common line. To be more specific, the set operation is started by pulling down the electric potential appearing on the bit line BL. In addition, the operation to return to the standby state after the operation to make the electric potentials equal to each other (or, to be more specific, after the time t4) is carried out by raising the electric potentials to the H level.

In the same way as the first embodiment, the equalize operation is carried out by the short-circuit switch 54. The equalize operation itself is the same as what is described in the explanation of the first embodiment. Also in the case of the second embodiment, by setting the equalize timing for prescribing the set operation at a timing different from the electric-potential change of the set pulse enable signal SetPlsEn, it is possible to get rid of a disturbance attributed to the current flowing to the variable-resistance storage element in the reset direction.

It is to be noted that, as explained earlier by referring to FIGS. 5 to 6H, the reset section 53 can be used also as an equalize section without newly providing the short-circuit switch 54. In addition, the block diagram of FIG. 10 can be applied as it is to this second embodiment.

3: Third Embodiment

Figure 13:
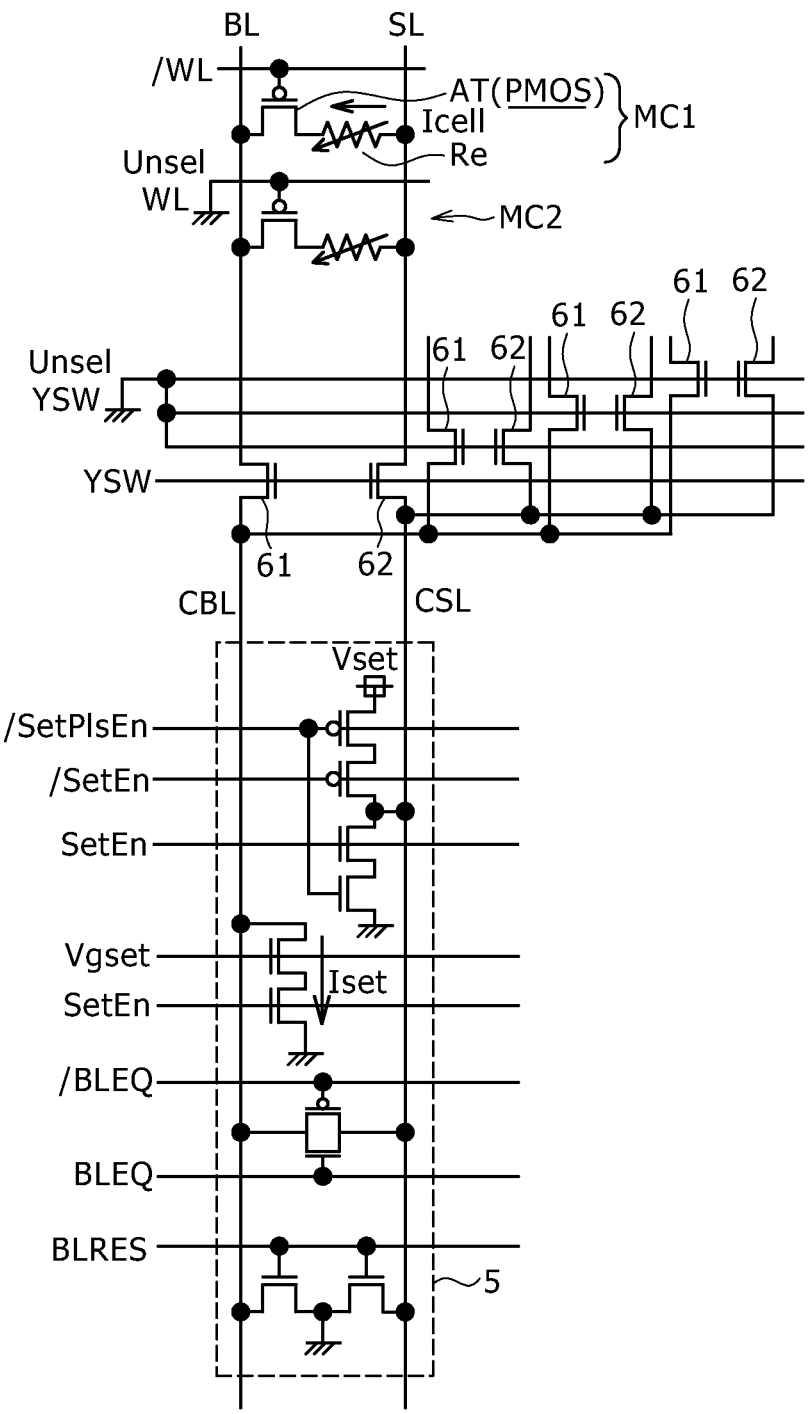
FIG. 13 is a diagram showing the configuration of a column circuit according to a third embodiment.

FIG. 13 is a diagram showing the configuration of a column circuit according to a third embodiment.

In the configuration shown in FIG. 13, the access transistor AT employed in every memory cell MC is obtained by replacing the NMOS transistor included in the second embodiment with a PMOS transistor. With the NMOS transistor of the second embodiment replaced by a PMOS transistor, it is necessary to invert the activation logic of the control signal asserted on the word line WL. To put it concretely, the signal WL shown in each of FIGS. 6B, 9B and 12B needs to be replaced with its inverted signal /WL. In addition, the block diagram of FIG. 10 can be applied as it is to this third embodiment.

Other circuit configurations of the first and second embodiments as well as other operation-waveform diagrams for these embodiments can be applied as they are to the third embodiment.

4: Fourth Embodiment

Figure 14:
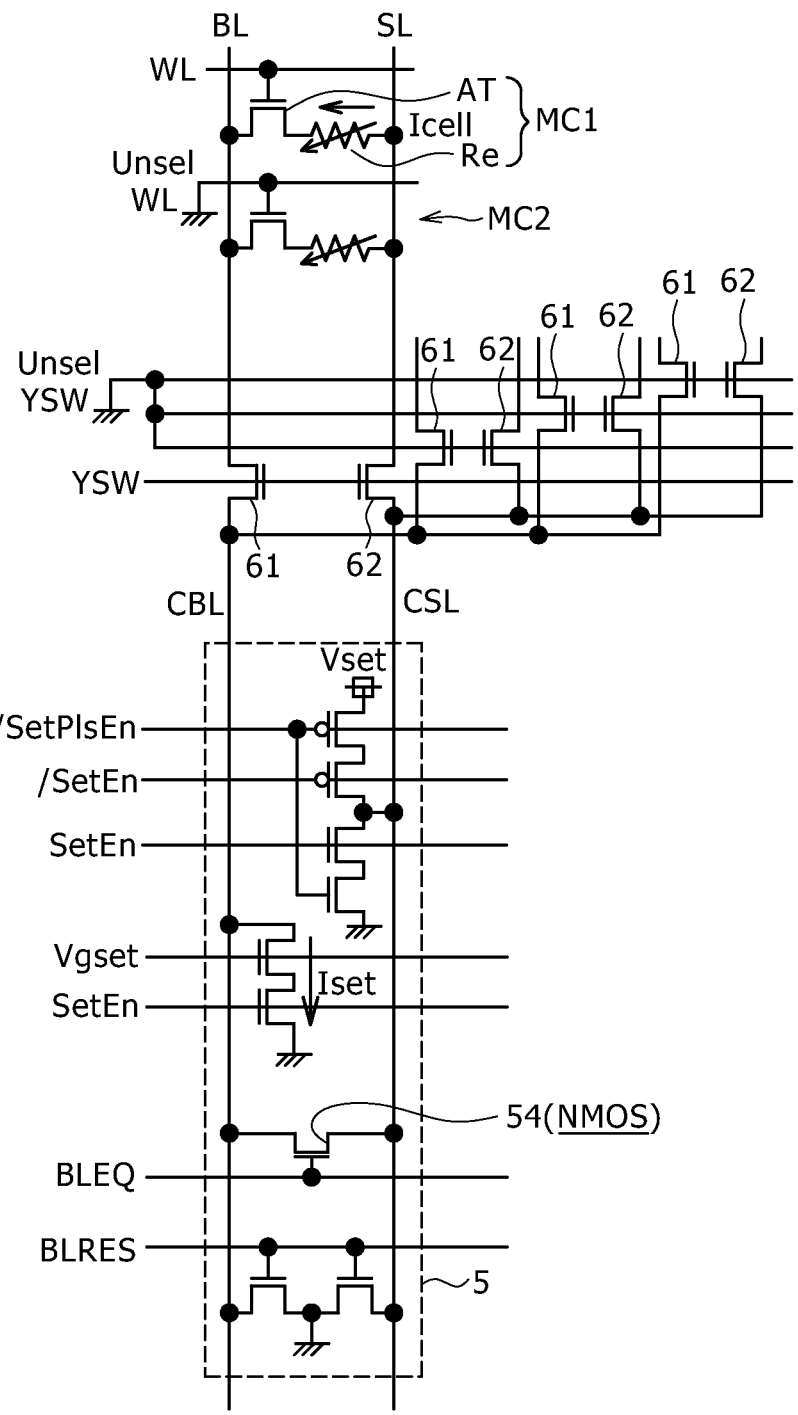
FIG. 14 is a diagram showing the configuration of a column circuit according to a fourth embodiment.

FIG. 14 is a diagram showing the configuration of a column circuit according to a fourth embodiment.

In the configuration shown in FIG. 14, only one NMOS transistor is used as the short-circuit switch 54. Thus, the short-circuit switch 54 is controlled by making use of only the equalize signal BLEQ. The operation-waveform diagrams shown in FIGS. 6A to 6H, FIGS. 9A to 9H, and FIGS. 12A to 12H can be applied as they are to the fourth embodiment. In addition, the block diagram of FIG. 10 can be applied as it is to this fourth embodiment.

Other circuit configurations of the fourth embodiment and operations carried out by this embodiment are identical with those of the first to third embodiments.

5: Fifth Embodiment

Figure 15:
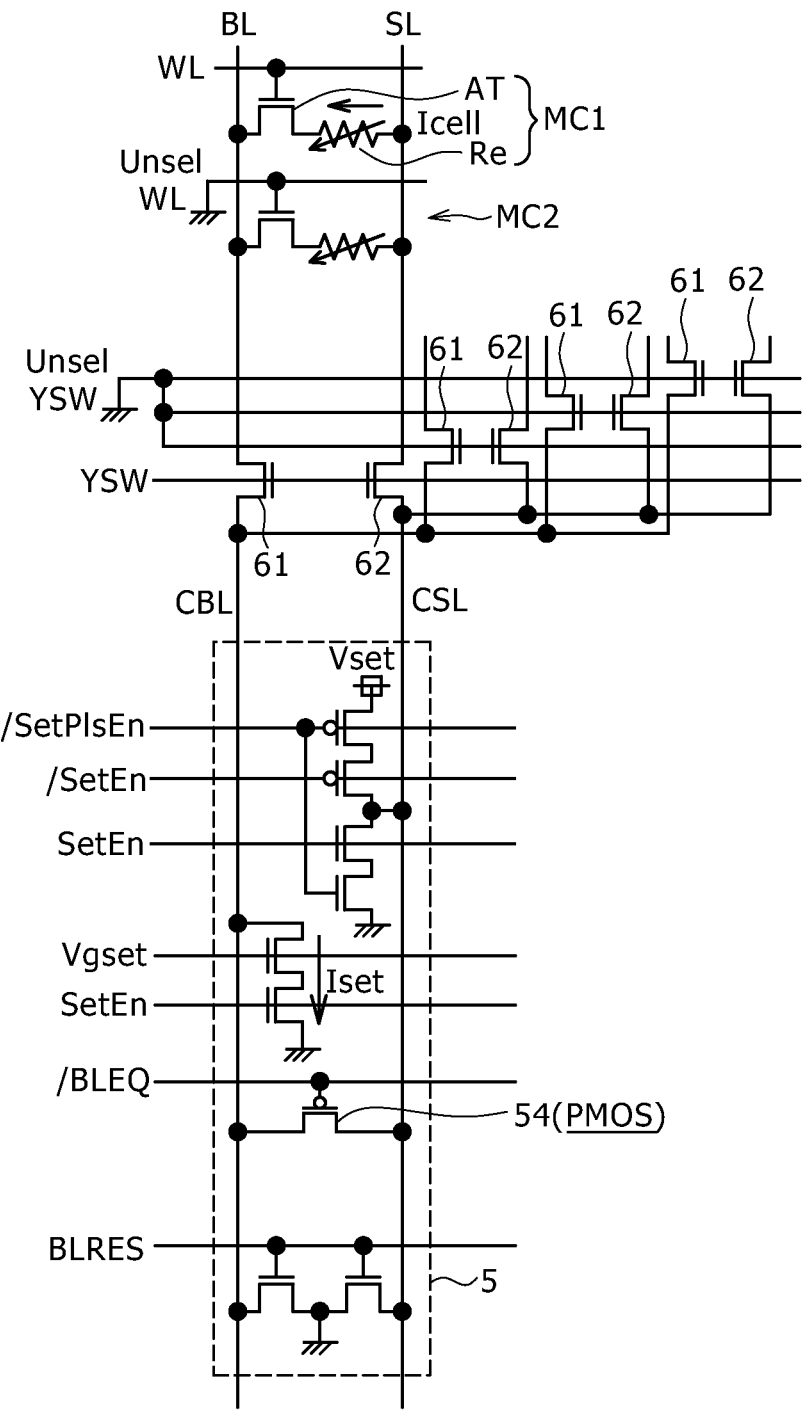
FIG. 15 is a diagram showing the configuration of a column circuit according to a fifth embodiment.

FIG. 15 is a diagram showing the configuration of a column circuit according to a fifth embodiment.

In the configuration shown in FIG. 15, only one PMOS transistor is used as the short-circuit switch 54. Thus, the short-circuit switch 54 is controlled by making use of only the inverted signal /BLEQ of the equalize signal BLEQ. The operation-waveform diagrams shown in FIGS. 6A to 6H, FIGS. 9A to 9H, and FIGS. 12A to 12H can be applied as they are to the fifth embodiment. In addition, the block diagram of FIG. 10 can be applied as it is to this fifth embodiment.

Other circuit configurations of the fifth embodiment and operations carried out by this embodiment are identical with those of the first to third embodiments.

As described above, in accordance with the presently disclosed technology, a resistance reduction operation also referred to as a set operation is started by changing an electric potential appearing on a second common line which can be a bit line BL or a source line SL and, during the resistance reduction operation, an element current Iset flowing through a variable-resistance resistive element Re is controlled by adjusting an electric potential appearing on a first common line which can reversely be the source line SL or the bit line BL. Then, the set operation is ended by making an electric potential appearing on the bit line BL equal to an electric potential appearing on the source line SL by making use of a reset section 53 or a short-circuit switch 54. These kinds of control are carried out by a driving control circuit which includes at least a set driver 5. Conceptually, the driving control circuit may include also a set control circuit 11 or an overall control circuit and a power-supply circuit 8.

As described above, the second common line is defined as a line, an electric potential appearing on which is changed at the start of the resistance reduction operation also referred to as a set operation. On the other hand, the first common line is defined as a line, an electric potential appearing on which is adjusted in order to control a current flowing through the storage element during the set operation. The set driver 5 has at least a voltage driver 51 serving as a voltage driving section configured to carry out operations including the operation to start the set operation by changing the electric potential appearing on the second common line. In addition, the set driver 5 also employs a current control section 52 for carrying out the control of the element current Iset by adjusting an electric potential appearing on the first common line. On top of that, the set driver 5 also includes an equalize section configured to end the set operation by making an electric potential appearing on the first common line equal to an electric potential appearing on the second common line. A typical example of the equalize section is the short-circuit switch 54 or the reset section 53.

As shown in FIGS. 9A to 9H and FIGS. 12A to 12H, the equalize section such as the short-circuit switch 54 is controlled to remain in a conductive state only during a predetermined period between times t3 and t5. The predetermined period includes a time t4 used as a timing with which the electric potential appearing on the second common line such as the source line SL is inverted.

The short-circuit switch 54 can be a P-type MOS transistor as shown in FIG. 15, an N-type MOS transistor as shown in FIG. 14 or a transmission gate TG as shown in FIGS. 8, 11 and 13. The transmission gate TG is configured to include two MOS transistors, that is, N-type MOS and P-type MOS transistors which have their source electrodes connected to each other and their drain electrodes also connected to each other as well. The N-type MOS and P-type MOS transistors of the transmission gate TG are driven by respectively two control signals having phases opposite to each other.

In the case of the first embodiment, the set operation is started by raising an electric potential appearing on the source line SL serving as the second common line from a low level such as the ground electric potential GND to a high level such as a set voltage Vset and, after an operation to make the electric potentials equal to each other, the electric potential appearing on the source line SL is restored to the low level.

In the case of the second embodiment, on the other hand, the set operation is started by pulling down an electric potential appearing on the bit line BL serving as the second common line from a high level such as the set voltage Vset to a low level such as the ground electric potential GND and, after the operation to make the electric potentials equal to each other, the electric potential appearing on the bit line BL is restored to the high level.

A proper type of the variable-resistance memory device based on the presently disclosed technology is typically a type having a structure like the one shown in FIGS. 4A and 4B. With such a type of the variable-resistance memory device, movements of conductive ions change the resistance of each variable-resistance storage element employed in the variable-resistance memory device. However, the presently disclosed technology can also be applied to a wide range of other variable-resistance memory devices such as a variable-resistance memory device making use of insulation-layer oxidations and insulation-layer reductions.

The present disclosure contains subject matter related to that disclosed in Japanese Priority Patent Application JP 2011-113268 filed in the Japan Patent Office on May 20, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A variable-resistance memory device comprising:
   a first common line;
   a second common line;
   a storage element connected between said first common line and said second common line to serve as a storage element whose resistance changes in accordance with a voltage applied to said storage element; and
   a driving control circuit for starting a resistance reduction operation of driving said storage element to make a transition from a high-resistance state to a low-resistance state by changing an electric potential appearing on said second common line, for controlling an element current flowing through said storage element by adjusting an electric potential appearing on said first common line during said resistance reduction operation and for terminating said resistance reduction operation by making said electric potential appearing on said first common line equal to said electric potential appearing on said second common line after the lapse of a period enabling said storage element to make said transition from said high-resistance state to said low-resistance state; and
   wherein an electric charge accumulated on the first common line is electrically discharged to the second common line through an equalization path, other than a current path of the storage element, before the resistance reduction operation.

2. The variable-resistance memory device according to claim 1, wherein said driving control circuit comprises:
   a voltage driving section configured to change said electric potential appearing on said second common line in order to generate a difference in electric potential between said first common line and said second common line and apply a voltage determined by said difference to said storage element at the start of said resistance reduction operation;
   a current control section configured to control said element current flowing through said storage element by adjusting said electric potential appearing on said first common line; and
   an equalize section configured to make said electric potential appearing on said first common line equal to said electric potential appearing on said second common line after the lapse of a period enabling said storage element to make said transition from said high-resistance state to said low-resistance state but before said voltage driving section inverts said electric potential appearing on said second common line or right after said voltage driving section has inverted said electric potential appearing on said second common line.

3. The variable-resistance memory device according to claim 2, wherein said equalize section includes
   a short-circuit switch connected between said first common line and said second common line to serve as a circuit for short-circuiting said first common line and said second common line to each other.

4. The variable-resistance memory device according to claim 3, wherein said equalize section puts said short-circuit switch in a conductive state only during a predetermined period including a timing with which said electric potential appearing on said second common line is inverted.

5. The variable-resistance memory device according to claim 3, wherein said short-circuit switch is a P-type metal-oxide semiconductor transistor, an N-type metal-oxide semiconductor transistor or another circuit configured to include two metal-oxide semiconductor transistors, that is, N-type metal-oxide semiconductor and P-type metal-oxide semiconductor transistors which have their source electrodes connected to each other and their drain electrodes also connected to each other as well and are driven by respectively two control signals having phases opposite to each other.

6. The variable-resistance memory device according to claim 2, wherein said voltage driving section is connected to said second common line to serve as a section configured to start said resistance reduction operation by changing said electric potential appearing on said second common line from a reference electric potential to a power-supply electric potential and to restore said electric potential appearing on said second common line from said power-supply electric potential back to said reference electric potential after the end of said resistance reduction operation;

said storage element is connected to said first common line through an access transistor whose gate electrode is receiving a fixed voltage during said resistance reduction operation in order to sustain said access transistor in a conductive state; and said current control section includes
a control circuit, and
a current control transistor connected between said first common line and a line for supplying said reference electric potential to serve as a current control transistor for controlling the magnitude of said element current in accordance with the level of an electric potential which is supplied to the gate electrode of said current control transistor and controlled by said control circuit.

7. The variable-resistance memory device according to claim 2, wherein:

said voltage driving section is connected to said second common line to serve as a section configured to start said resistance reduction operation by changing said electric potential appearing on said second common line from a power-supply electric potential to a reference electric potential and to restore said electric potential appearing on said second common line from said reference electric potential back to said power-supply electric potential after the end of said resistance reduction operation;

said storage element is connected to said second common line through an access transistor whose gate electrode is receiving a fixed voltage during said resistance reduction operation in order to sustain said access transistor in a conductive state; and said current control section includes
a control circuit, and
a current control transistor connected between said first common line and a line for supplying said power-supply electric potential to serve as a current control transistor for controlling the magnitude of said element current in accordance with the level of an electric potential which is supplied to the gate electrode of said current control transistor and controlled by said control circuit.

8. The variable-resistance memory device according to claim 6, wherein said storage element is provided between two electrodes to include:

a conductive-ion supplying layer for supplying conductive ions; and a variable-resistance layer brought into contact with said conductive-ion supplying layer to receive said conductive ions injected from said conductive-ion supplying layer or return said conductive ions already injected in said variable-resistance layer back to said conductive-ion supplying layer in accordance with the direction of a voltage applied between said two electrodes.

9. An operation method for operating a variable-resistance memory device including a first common line, a second common line and a storage element connected between said first common line and said second common line to serve as an element having a resistance varying in accordance with a voltage applied to said element, said operation method comprising:

starting a resistance reduction operation of driving said storage element to make a transition from a high-resistance state to a low-resistance state by changing an electric potential appearing on said second common line;

controlling an element current flowing through said storage element by adjusting an electric potential appearing on said first common line during said resistance reduction operation;

terminating said resistance reduction operation by making said electric potential appearing on said first common line equal to said electric potential appearing on said second common line after the lapse of a period enabling said storage element to make said transition from said high-resistance state to said low-resistance state; and, electrically discharging, to the second common line, an electric charge accumulated on the first common line through an equalization path, other than a current path of the storage element, before the resistance reduction operation.

10. The operation method for operating a variable-resistance memory device according to claim 9, wherein said method includes:

configuring a voltage driving section to change said electric potential appearing on said second common line in order to generate a difference in electric potential between said first common line and said second common line and apply a voltage determined by said difference to said storage element at the start of said resistance reduction operation;

configuring a current control section to control said element current flowing through said storage element by adjusting said electric potential appearing on said first common line; and configuring an equalize section to make said electric potential appearing on said first common line equal to said electric potential appearing on said second common line after the lapse of a period enabling said storage element to make said transition from said high-resistance state to said low-resistance state but before said voltage driving section inverts said electric potential appearing on said second common line or right after said voltage driving section has inverted said electric potential appearing on said second common line.

11. The operation method for operating a variable-resistance memory device according to claim 10, wherein said equalize section includes:

a short-circuit switch connected between said first common line and said second common line to serve as a circuit for short-circuiting said first common line and said second common line to each other.

12. The operation method for operating a variable-resistance memory device according to claim 11, wherein said equalize section puts said short-circuit switch in a conductive state only during a predetermined period including a timing with which said electric potential appearing on said second common line is inverted.

13. The operation method for operating a variable-resistance memory device according to claim 11, wherein said short-circuit switch is a P-type metal-oxide semiconductor transistor, an N-type metal-oxide semiconductor transistor or another circuit configured to include two metal-oxide semiconductor transistors, that is, N-type metal-oxide semiconductor and P-type metal-oxide semiconductor transistors which have their source electrodes connected to each other and their drain electrodes also connected to each other as well and are driven by respectively two control signals having phases opposite to each other.

* * * * *